United States Patent [19]

Ulmer, Jr.

[11] Patent Number: 5,008,611

[45] Date of Patent: Apr. 16, 1991

[54] METHOD OF ELIMINATING THE EFFECTS OF BIREFRINGENCE FROM THE DETECTION OF ELECTRIC CURRENT USING FARADAY ROTATION

[75] Inventor: Edward A. Ulmer, Jr., Clearwater, Fla.

[73] Assignee: Square D Company, Palatine, Ill.

[21] Appl. No.: 323,599

[22] Filed: Mar. 14, 1989

[51] Int. Cl.⁵ ..................... G01R 15/00; G01R 31/00
[52] U.S. Cl. ..................................... 324/96; 250/225; 350/374
[58] Field of Search ............. 250/225, 231 R; 324/96; 350/374, 376

[56] References Cited

U.S. PATENT DOCUMENTS

| | | |
|---|---|---|
| 3,324,393 | 6/1967 | Casey et al. ............................ 324/96 |
| 3,707,321 | 12/1972 | Laecklin et al. ...................... 324/96 |
| 3,743,929 | 7/1973 | Lesuer ................................. 250/225 |
| 3,980,949 | 9/1976 | Feldtkeller . |
| 4,035,083 | 7/1977 | Woodriff et al. .................... 250/225 |
| 4,255,018 | 3/1981 | Ulrich et al. ......................... 350/375 |
| 4,564,754 | 1/1986 | Sato et al. ............................. 324/96 |
| 4,683,421 | 7/1987 | Miller et al. .......................... 250/225 |
| 4,694,243 | 9/1987 | Miller et al. ........................... 324/96 |
| 4,755,665 | 7/1988 | Ulmer, Jr. et al. ............. 250/214 R |

OTHER PUBLICATIONS

"Fine Annealing of Optical Glass for Low Residual Stereo and Refractive Index Homogenity", by Hagy et al., Applied Optics, vol. 7, #5, 5/68, pp. 833–835.
"Optical-Fiber Copolymer-Film Electric-Field Sensor", by Mermelstein, Applied Optics, vol. 22, #7, 4/83, pp. 1006–1009.
"Optical Methods for Measurement of Voltage and Current on Power Systems", by Rogers Optics & Laser Technol., 12/77, pp. 273–283.
"Characteristic Directions in Optics of Twisted Birefringent Media", by Aben, pp. 1414–1421, Journ. of Opt. Soc. of Amer., vol. 3, #9, 9/86.

*Primary Examiner*—Reinhard J. Eisenzopf
*Assistant Examiner*—William Burns
*Attorney, Agent, or Firm*—Michael J. Femal; Hugh M. Gilroy

[57] ABSTRACT

An improved method and apparatus for measuring a target electric current utilizing a Faraday effect in which an optical medium is magnetically coupled with the target electric current and light is passed through the optical medium at an orientation for which the effects of birefringence on the optical medium can be disregarded in comparison with the Faraday effect, and the light departing from the optical medium is measured and analyzed in a manner permitting the target current to be accurately determined.

29 Claims, 17 Drawing Sheets

STEP 1

ENTER MATERIAL AND GEOMETRIC DATA APPROPRIATE FOR THE PARTICULAR SENSOR BEING DESIGNED PLUS A VALUE FOR THE ELECTRIC CURRENT IN THE CONDUCTOR.

STEP 2

ENTER AN INITIAL TRIAL VALUE FOR THE MAGNITUDE OF THE ANGLE, $\alpha$, BETWEEN THE POLARIZER TRANSMISSION AXIS AND THE CHARACTERISTIC DIRECTION IN THE OPTICAL MEDIUM AND SET ANALYZER AXIS, AT $\Psi = \alpha + 45$ DEGREES OR $\Psi = \alpha - 45$ DEGREES.

STEP 3

COMPUTE THE VALUE OF THE SIGNAL FROM THE FARADAY EFFECT WITH THE BIREFRINGENCE SET TO ZERO AND SET THIS EQUAL TO THE "TRUE VALUE" OF THE FARADAY EFFECT SIGNAL.

STEP 4

COMPUTE THE VALUES OF THE SIGNALS FROM THE OPTICAL MEDIUM USING SEVERAL DIFFERENT NON-ZERO VALUES FOR THE BIREFRINGENCE.

STEP 5

COMPARE THE COMPUTED SIGNALS FROM STEP 4 WITH THE COMPUTED "TRUE VALUE" IN STEP 3. DETERMINE: DID THE TRIAL POLARIZER ANGLE FROM STEP 2 PRODUCED SIGNALS IN STEP 4 THAT DEVIATED BY INSIGNIFICANT AMOUNTS FROM THE SIGNAL IN STEP 3.

IF YES: CALCULATION COMPLETE. USE TRIAL POLARIZER ANGLE IN SETTING UP APPARATUS.

IF NO: PROCEED TO STEP 6.

STEP 6

SELECT A NEW TRIAL POLARIZER ANGLE.

GO TO STEP 3.

FIG. 7

EQUATION 1
$$\theta = \mu V \int H \, dl$$

EQUATION 2
$$\theta = f(\mu, V, L, J)$$

EQUATION 3
$$(\phi/2)^2 = (\beta/2)^2 + F^2$$

EQUATION 4
$$\begin{bmatrix} E_{xo} \\ E_{yo} \end{bmatrix} = \begin{bmatrix} \cos(\phi L/2) - j\frac{\beta}{\phi}\sin(\phi L/2) & \frac{-2F}{\phi}\sin(\phi L/2) \\ \frac{2F}{\phi}\sin(\phi L/2) & \cos(\phi L/2) + j\frac{\beta}{\phi}\sin(\phi L/2) \end{bmatrix} \begin{bmatrix} E_{xi} \\ E_{yi} \end{bmatrix}$$

EQUATION 5
$$\begin{bmatrix} E_{xi} \\ E_{yi} \end{bmatrix} = \begin{bmatrix} T_p \cos\alpha & 0 \\ 0 & T_p \sin\alpha \end{bmatrix} \begin{bmatrix} E_{px} \\ E_{py} \end{bmatrix}$$

*FIG. 12*

EQUATION 6

$$\begin{bmatrix} E_{ax} \\ E_{ay} \end{bmatrix} = \begin{bmatrix} T_a \cos \Psi & 0 \\ 0 & T_a \sin \Psi \end{bmatrix} \begin{bmatrix} E_{xo} \\ E_{yo} \end{bmatrix}$$

EQUATION 7

$$E_a(\alpha, \Psi) = T_p T_a E_p \{\cos(\phi \tfrac{L}{2}) \cos(\Psi - \alpha) \pm \tfrac{2F}{\phi} \sin(\phi \tfrac{L}{2}) \sin(\Psi - \alpha) - j\tfrac{\beta}{\phi} \sin(\phi \tfrac{L}{2}) \cos(\Psi + \alpha)\}$$

EQUATION 8

$$\Gamma_o(\alpha, \Psi) = \Gamma_i \{\cos^2(\phi L/2) \cos^2(\Psi - \alpha) + \tfrac{4F^2}{\phi^2} \sin^2(\phi L/2) \sin^2(\Psi - \alpha) \pm \tfrac{F}{\phi} \sin(\phi L) \sin(2(\Psi - \alpha)) + (\tfrac{\beta^2}{\phi^2}) \sin^2(\phi L/2) \cos^2(\Psi + \alpha)\}$$

EQUATION 9

$$\theta = \mu_o V N J$$

EQUATION 10

$$\Gamma_o = \Gamma_i (\tfrac{1}{2}) \{1 + \sin(2\theta)\}$$

*FIG. 12 (cont.)*

METHOD OF ELIMINATING THE EFFECTS OF BIREFRINGENCE FROM THE DETECTION OF ELECTRIC CURRENT USING FARADAY ROTATION

BACKGROUND OF THE INVENTION

The invention relates to methods and apparatus for detecting electric current using the Faraday effect.

Measuring electric current using the Faraday effect has been employed in the electric power industry to measure alternating currents on high-voltage transmission lines. Generally, the Faraday effect relates to the measurable changes in the polarization of light precipitated by its propagation through the magnetic field surrounding the current to be detected and measured. In order to isolate the light which is used to detect and measure the electric current using the Faraday effect such light is normally linearly polarized and propagated through a fixed optical medium so that the effect of the magnetic field upon it can be readily measured.

The Faraday effect is an induced circular birefrigence of a transparent material, where the induced circular birefringence is caused by a magnetic field. Accordingly, when a light wave is passed through a transparent material in the presence of a magnetic field, the magnetic field has the effect of rotating the plane of polarization of the light wave. If a transparent optical material were placed near an electric current the magnetic field surrounding the electric current would provide such a magnetic field. This provides a means of measuring electric currents using the Faraday effect. The method is generally described as placing an optical medium in close proximity to an electric current and, under controlled conditions, propagating a light wave through this optical medium. The action of the Faraday effect on the light wave as it passes through the optical medium and is influenced by the electric current's magnetic field potentially can provide a meaningful measurement of the electric current itself.

Linearly polarized light is used in these devices. In order to better understand the action of the Faraday effect is useful to consider the linearly polarized light as decomposed into two counter-rotating circularly polarized light waves of equal amplitude. In the absence of a magnetic field in an isotropic medium these left-hand and right-hand circularly polarized light waves travel at equal velocity. The two indices of refraction $n_l$ and $n_r$ for the left-hand and right-hand light waves are equal. The magnetic field creates a difference between $n_l$ and $n_r$. One circular polarization travels faster than the other, and the net effect is a rotation of the linearly polarized light that is produced when the two circular light waves are recomposed.

The direction of polarization is rotated in response to the component of the magnetic field that is parallel to the direction of transmission of the light wave. The strength of the Faraday effect in a given non-ferromagnetic medium is measured by the Verdet constant, V. The Verdet constant expresses a proportionality between the angular amount of rotation, $\theta$, of the plane of polarization of the light, and the product of the magnetic field strength, H, with the distance, L, the light travels through the medium in the presence of the magnetic field.

The relationship in meters-kilograms-second (mks) units is given by Equation 1, Table 1.

The state of polarization of the light wave is changed by interaction with transparent material. The change in the state of polarization is caused by both the Faraday effect resulting from the magnetic field produced by the current J and other properties of the transparent material. Stress birefringence in transparent material is particularly important in causing an unwanted change in the state of polarization of a light wave as it passes through transparent material.

Optical materials are never perfectly homogenous. Anisotropy in the refractive index is termed birefrigence. Linearly polarized light is converted to elliptically polarized light as it passes through a birefrigent material, because the birefringence disturbs the light wave. Residual birefringence is present to a greater or lesser extent in all optical materials, and is due to the (usually small) thermal stresses present in the material. As will be discussed later additional stress birefringence results when a bulk optical material is subjected to stresses from temperature variations.

As illustrated in FIG. 1 birefringent transparent Faraday material (70) has a characteristic direction indicated by arrow (72) at entrance face (78). The characteristic direction of the transparent material is defined in terms of the influence of the transparent material on linearly polarized light passing through the transparent material in the absence of a magnetic field. When a linearly polarized light wave (74) incident upon the transparent material (70) has its direction of polarization (76), aligned with a characteristic direction (72) of the transparent material (70), then the light emerges from the transparent material (70) linearly polarized. When the direction of polarization of the linearly polarized light (74) makes an arbitrary angle with the characteristic direction (72) of the transparent material (70), then the light emerges from the exit face (79) of the transparent material (70) elliptically polarized.

A transparent material has a characteristic direction as a result of electrical anisotropy of the transparent material. The electrical anisotropy of the transparent material gives rise to principal dielectric axes of the transparent material, as disclosed more fully in the textbook by M. Born and E. Wolf, "Principles of Optics" Pergamon Press, Sixth Edition, 1985.

The Born and Wolf textbook points out that in the general electrical anisotropic case a material will have three characteristic directions corresponding to the three principal axes of the dielectric tensor. The characteristic directions of optical materials has been further explored by H. K. Aben in an article entitled "Characteristic Directions in Optics of Twisted Birefringent Media" (Journal of the optical Society of America A/- Vol. 3, No. 9, September 1986, pages 1414–1421). Aben points out that for inhomogeneous birefrigent optical media there are always two perpendicular characteristic directions. Light entering the medium with its electric field vector aligned with either of these characteristic directions will emerge from the medium also linearly polarized. That is, Aben points out that the medium always possesses two mutually orthogonal characteristic directions. This anisotropy noted above manifests itself as a difference in the index of refraction for the electric field components of the light wave parallel to each direction. As a result of the differences in the indicies the electric field components of the light wave move at different velocities. Consequently it is common to refer to a "fast" characteristic direction or a "slow" characteristic direction in the optical medium depending on the relative velocity of the components of the light wave parallel to the directions.

A variety of technologies exist to exploit the Faraday effect for the purpose of electric current detection and measurement. One popular method has been to enhance the magnetic field arising from the current by capturing it with a ferromagnetic ring and concentrating it upon an optical medium. Such a device is taught in Casey, et al, U.S. Pat. No. 3,324,393, issued on June 6, 1967. Another such device is taught in Feldtkeller U.S. Pat. No. 3,980,949, issued Sept. 14, 1976. In this device rather than surrounding the current with a magnetic ring the target current is passed around a ferromagnetic device a number of times. The ferromagnetic device, similar to one element of a transformer, then concentrates the magnetic field through a bulk optical material. This device has the disadvantage of disturbing the electric current by the inductance of the ferromagnetic element. These early devices do not deal with the effects of stress birefringence in the optical medium.

A recurring, but not adequately solved, problem with such devices is that of separating the effect of the phenomenon of stress birefringence upon the optical medium within the Faraday effect electric current detector, particularly such stress birefringence which can result from temperature changes in the optical medium. As an example of why stress birefringence is an important problem, such Faraday effect devices can be used as instrument transformers to measure electric current. Such equipment frequently is positioned outdoors and in environments with extreme climatic conditions. In such cases the widely changing temperatures create within the optical medium a high level of stress birefringence. Such a variation of the stress birefringence creates a serious problem since it alters the light wave and distorts the signal produced by the Faraday effect. This compromises the results achieved in the Faraday effect current detection and measurement system. A number of devices teach methods of overcoming this problem.

Some devices teach methods and apparatus for measuring a variety of the parameters of the light propagating through the medium and, based upon systematic calculations, separating the effects of stress birefringence from the Faraday effect produced by the current to be measured. While such devices have been found to work with a reasonable degree of accuracy, they have the disadvantage of complexity and in some cases the uncertainty inherent in the cascading of calculations necessary to deal with the disturbance caused by the stress birefringence.

An early attempt at removing the effects of stress birefringence is taught by Jaeckiln, U.S. Pat. No. 3,707,321, Dec. 26, 1972. Jaecklin teaches splitting the selectively polarized analyzing light beam into two components whose relative orientations are adapted to very nearly cancel out what are presumed to be equal and opposite stress birefringent effects. This leaves the Faraday effect as the sole source of any polarization shift in the analyzing beam. However, Jaecklin's device can only cancel out the effects of a single, unchanging value of the birefringence. In addition, a beamsplitter in his device can itself alter the state of polarization of the lightwave.

Another attempt at Faraday effect electric current detection is taught in Sato, et al, U.S. Pat. No. 4,564,754, Jan. 14, 1983. Sato also teaches a unique configuration of optical elements which are useful in eliminating the effects of nearby currents from interfering with the desired Faraday effect. This is accomplished by surrounding the target current with an optical network and by providing for two light wave reflections at each turn of the optical components around the target current. Sato ignores the problems created by birefringence, but is useful as an example of Faraday effect electric current detectors and the related signal processing. The inventor has previously published an article (*High Accuracy Faraday Rotation Measurements*, Ulmer, Paper No. ThCC 21, Pages 288–291, 1988 Technical Digest of Optical Fiber Sensors, New Orleans, La., January 1988) describing the calculations and methods existing to ferret out the results of stress birefringence in Faraday effect current measurements. Additionally, the inventor has been issued letters patent (Ulmer, Hooper, U.S. Pat. No. 4,755,665, July 5, 1988) on an apparatus useful in incorporating these methods in achieving accurate Faraday effect measurements.

Ulrich et al, U.S. Pat. No. 4,255,018, issued Mar. 10, 1981, teaches an attempt to eliminate the effects of birefringence from the Faraday effect of the light passing through the optical medium. It teaches an optical material which is, in fact, a twisted optical fiber. The theory behind this device is that twisting the optical fiber tends to "swamp out" the linear stress birefringence around the optical loop. However, the axial stress created by the twisting is itself temperature dependent thereby creating a new source of signal variations in the design by Ulrich.

A good overview of the current state of Faraday effect sensors is provided in *Faraday Effect Sensors: The State of the Art*, G. W. Day and A. H. Rose, National Bureau of Standards, 1988. This includes a discussion of several techniques for eliminating the undesired effects of birefringence. With respect to bulk optical materials, the proposed solutions concern utilizing materials which are very stable over changes in temperature. Such materials, such as SF-57, are very costly, and difficult to polish.

A further means of reducing the magnitude of the birefringence within a coiled optical fiber is developed in Day and Rose. It is accomplished by annealing the fiber while looped. A problem with this technique is that it requires removal of the protective plastic buffer on the optical fiber. The bare glass fiber is exposed and is very fragile and difficult to work with. Annealing can also be used on bulk optical materials in order to reduce the absolute value of the birefringence.

What is required but not provided in the present state of the art is a simplified Faraday effect system of accurately detecting and measuring electric current which is not affected by stress birefringence.

SUMMARY OF THE INVENTION

The present invention teaches a method of providing a Faraday effect system for which the stress birefringence and changes in the stress birefringence on safely be ignored. Calculations of light propagating in a birefringent Faraday material are used to predetermine an orientation in the apparatus of the principal optical elements with respect to each other. This predetermined orientation of the present invention creates a basic optical signal proportional exclusively to the Faraday effect. The subsequent signal processing is simplified with respect to presently available systems since it need not account for the distorting effects of stress birefrigence.

By eliminating the distorting effects of birefringence and changes in the birefringence the present invention improves the stability of the Faraday effect electric current detection and measurement system over a broad range of temperatures since temperature changes are predominantly responsible for changes in the stress birefringence.

Whereas in prior methods, means of "calculating out" the effects of stress birefringence were required, the present invention eliminates the effect of stress birefringence before the Faraday effect current detector is put to use.

The invention is based upon the inventor's discovery of the effects of birefringence and, in particular, how the output signal of the sensor depends upon the polarization angle of the incident lightwave with respect to the characteristic direction of the optical medium. The polarization angle and characteristics direction are measured in planes perpendicular to the direction of the propagation of the light wave.

The present invention principally utilizes the inventor's method of calculations and experimentation which demonstrate that orienting the polarization axis of a beam of light at certain angles with respect to a characteristic direction in a birefringent optical medium permits the light wave to pass through the optical medium and to produce the same output signal that would be produced in the absence of stress birefringence in the presence of an alternating electric current. Accordingly, the light wave can be propagated into an optical medium at one of such determined angles and its rotation measured upon departure from such an optical medium with confidence that the signal produced is almost exclusively the result of Faraday rotation and that no significant distortion has resulted from the presence of stress birefringence. This significantly simplifies the apparatus and techniques of accurately measuring and detecting electric currents by the Faraday effect.

It is then an object of the present invention to provide a method for accurately measuring and detecting electric current by the Faraday effect, particularly alternating electric current.

It is a further object of the invention to provide such a Faraday effect electric current detection method which is not significantly affected by the stress birefringence in the optical medium.

It is a further object of the invention to provide such a Faraday effect electric current detection and measurement system which is not significantly affected by changes in temperature.

It is a further object of the invention to provide such a Faraday effect electric current detection and measurement system which operates with simple electronic detection circuits that do not need to account for the distorting effects of birefringence.

It is a further object of the invention to provide a method for determining certain angles of the polarizer transmission axis with respect to the characteristic direction of optical medium for which the effects of stress birefringence can be ignored.

It is a further object of the invention to teach an optically coupled transducer apparatus based upon the concentrated magnetic ring with a bulk optical material which incorporates the inventor's method of eliminating the effects of stress birefringence in the art of Faraday effect electric current detection.

It is further object of the invention to teach an optically coupled transducer apparatus which is based on the optical ring system of Faraday effect electric current detection which incorporates the inventor's method of eliminating the effects of stress birefringence from the optical medium.

Other features and advantages of the present invention will be apparent from the following description in which the preferred embodiments have been set forth in conjunction with the accompanying drawings.

BRIEF DESCRIPTION OF THE DRAWINGS

FIG. 7 depicts, in block diagram form, the steps involved in computing non-birefringent polarization angles.

FIG. 12 shows Table 1 which is a recitation of the formulae used in the related mathematical calculations.

DETAILED DESCRIPTION OF THE PREFERRED EMBODIMENTS

Figure 1:
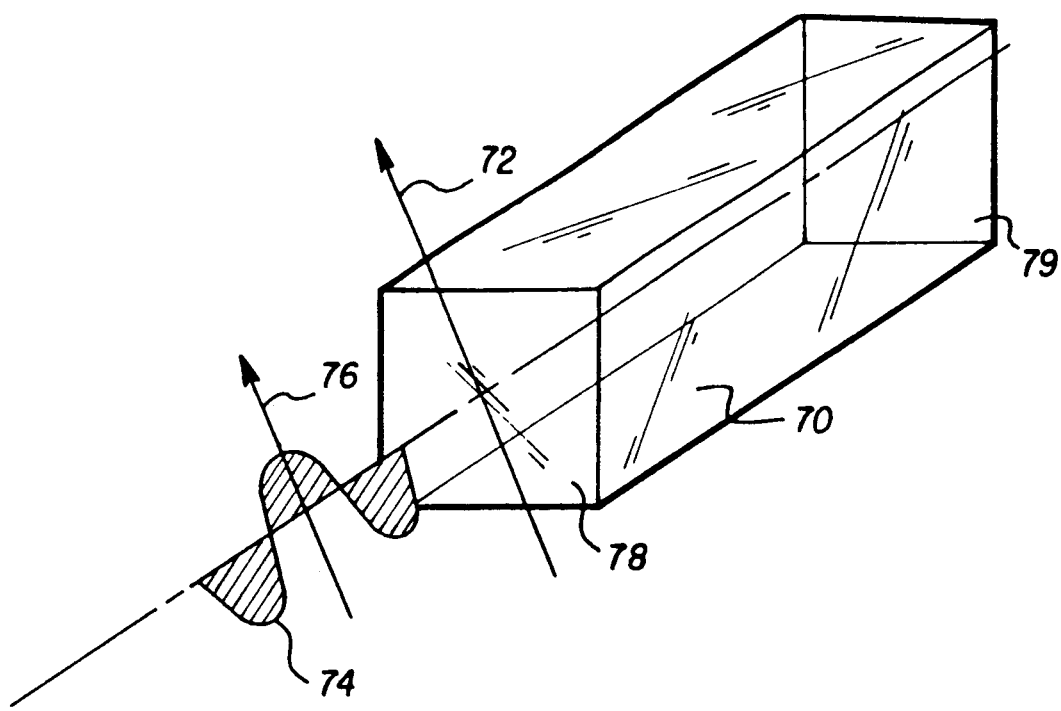
FIG. 1 is a diagram of a characteristic direction.

It is helpful to being by identifying the key optical terms and parameters used in defining the invention. Whenever appropriate, reference numerals will conform throughout all figures. Certain block diagrams will be presented, but always will be supported by a Figure depicting the apparatus with appropriate reference numerals.

The general forms of existing Faraday effect electric current detectors have been shown in the Background. The components common to each are shown in the block diagram at FIG. 2. The form of the optical medium may be varied within the spirit and scope of Faraday effect electric current detection as will be developed herein.

These basic elements include a light source (21), a means of coupling (22) the light source to the linear polarizer, a linear polarizer (23), a transparent optical medium (24), a second linear polarizer which is commonly referred to as the analyzer (25), a means of coupling (26) the light from the analyzer (25) to the photodetector/pre-amplifier (27), a system of circuits (28) to separate the alternating (or AC) portion of the signal from the steady (or DC) portion of the signal plus a circuit to divide these two portions (AC/DC), and a final signal processor (29) to create an output signal proportional to the target electric current flowing through the conductor (32). The target electric current flowing in powerline conductor (32) is coupled to the transparent optical medium (24) by a magnetic field (33) created by the target electric current flowing through the conductor (32).

Figure 2:
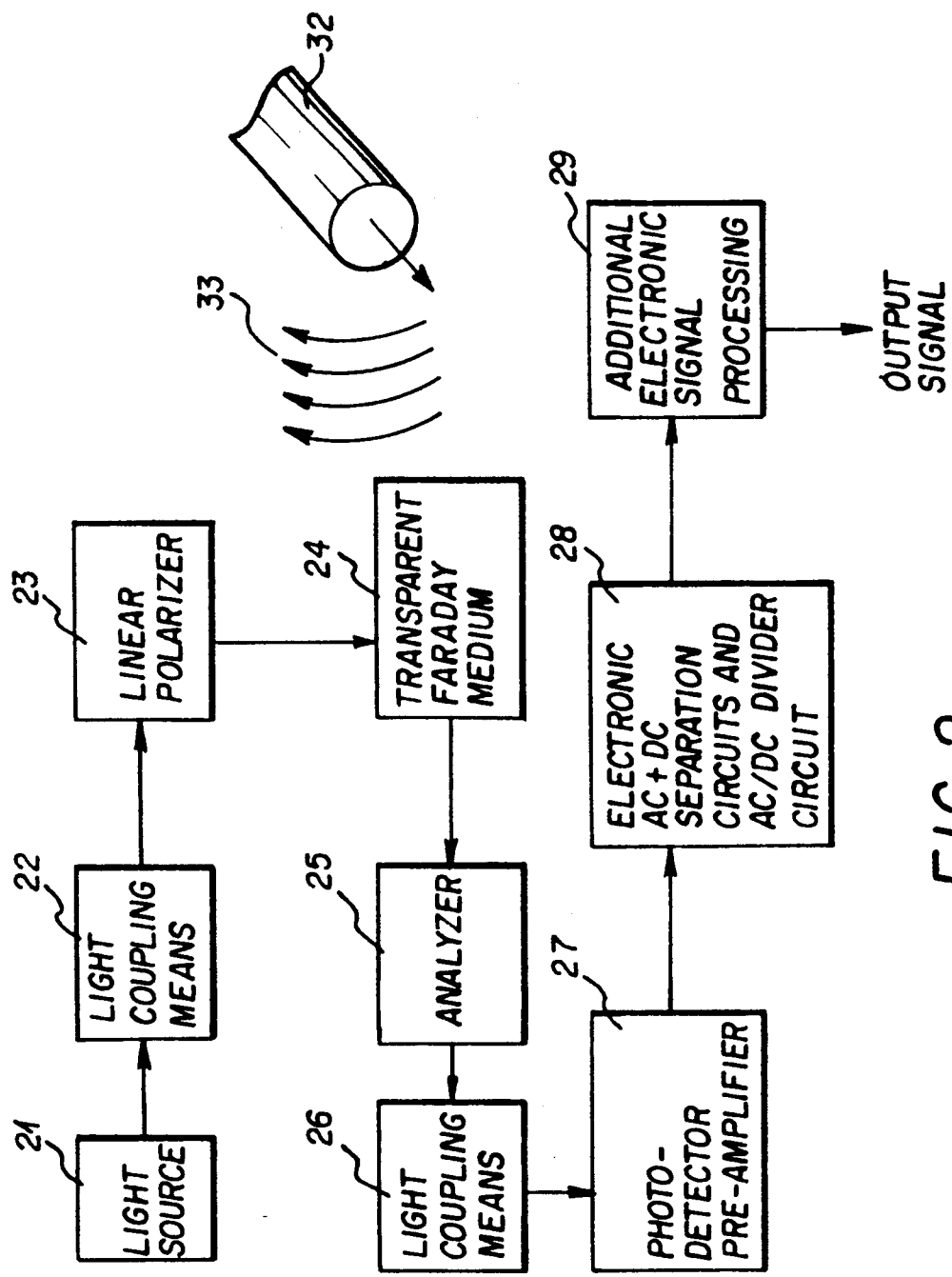
FIG. 2 is a block diagram depicting the elements of a typical Optical Current Transducer (hereinafter OCT) system.
Figure 3A:
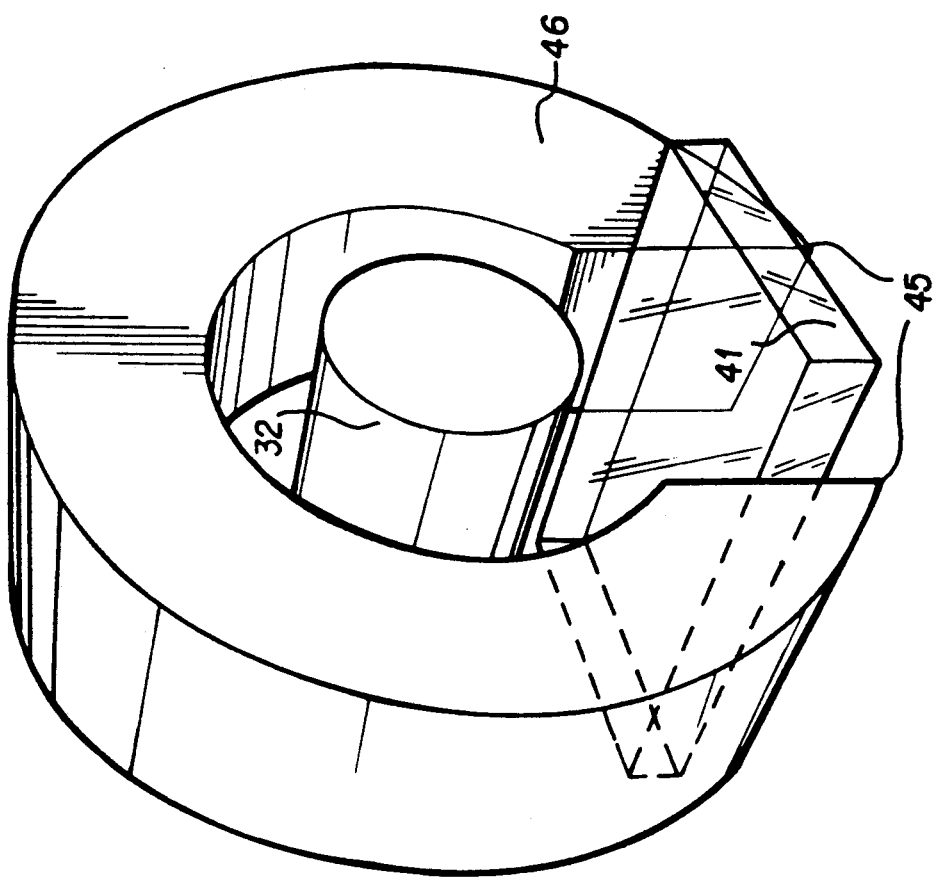
FIGS. 3A, 3B, and 3C are depictions of different possible optical media which can be used in OCT systems.
Figure 3B:
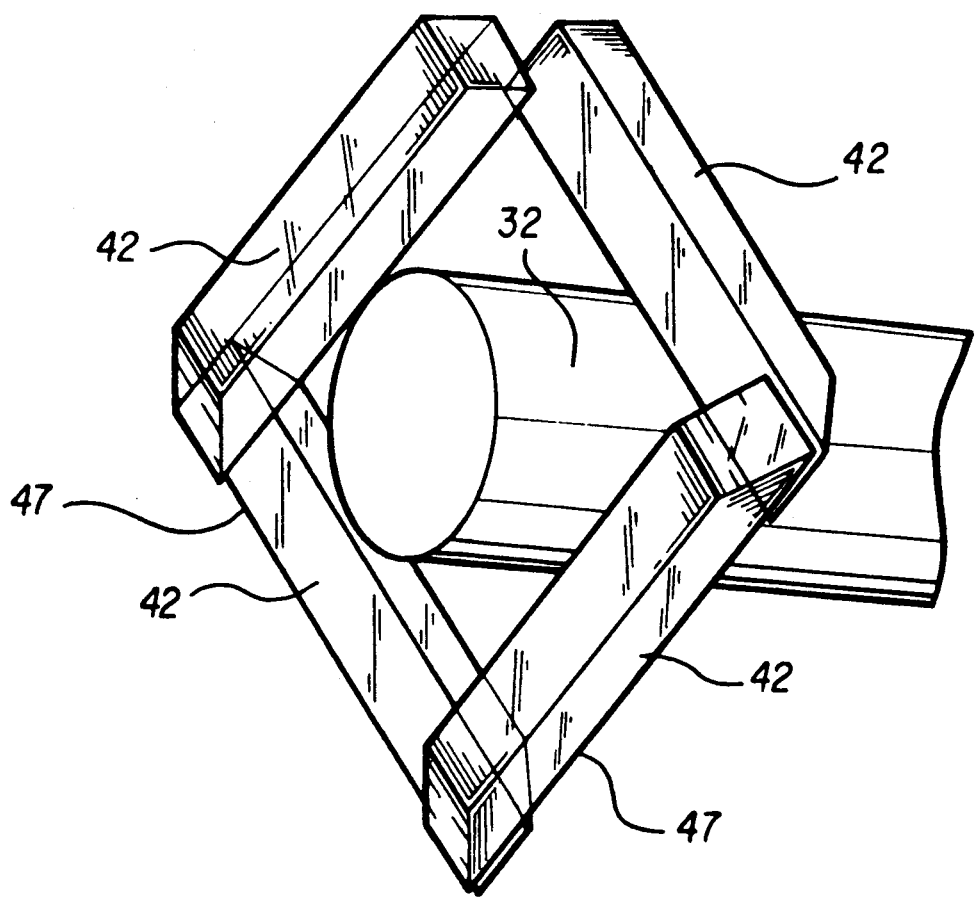
Figure 3C:
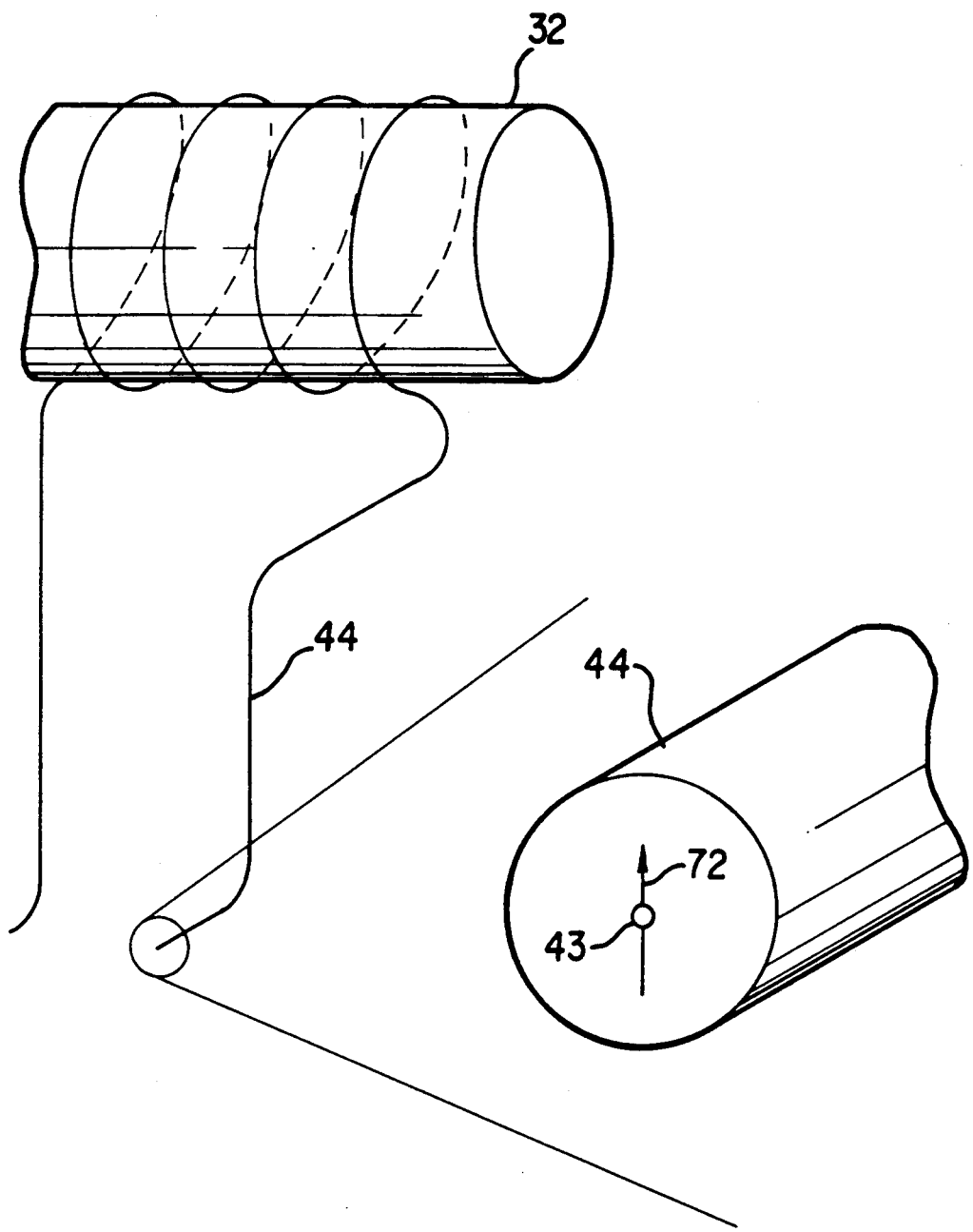

FIGS. 3A, 3B, and 3C illustrate three different arrangements for the transparent Faraday material (41, 42, 43) and the powerline (32) from FIG. 2. Other required elements from FIG. 2 are not shown in FIGS. 3A, 3B, and 3C. All of these arrangements are known in the prior art and each illustrate a different apparatus which may be used to construct an electric current sensor based on the Faraday effect. These three types are: (A) As illustrated in FIG. 3A a single, bulk piece of Faraday material (41) is inserted in the gap (45) of a C-shaped ferromagnetic magnetic field concentrator (46) which surrounds the powerline (32); (B) FIG. 3B shows a ring (47) formed from several pieces (42) of bulk glass which surround the powerline (32); and (C) as pictured in FIG. 3C the transparent Faraday medium may be the core (43) of single-mode optical fiber (44) which can be looped one or more times around the powerline (32).

The concept of the present invention is to improve all of these existing forms of OCT's by providing a method for selecting an orientation of the principal optical elements for which the effects of stress birefringence may be ignored.

The preferred embodiment of the invention will first be described with respect to the magnetic concentrator form of Faraday effect electric current detector as generally depicted in FIG. 3A. We being by discussing the optical parameters of the system. Reference will be made to the equations (Table 1) and the FIG. 4, which depicts the optical elements of a magnetic concentrator detection system in isolation.

Typical values of the Verdet constant for the transparent Faraday materials normally used in these electric current sensors are so small that it has often proved desirable to either increase the path length, L, or the magnetic field, H, in Equation 1 of Table 1. FIG. 3A illustrates a design that seeks to increase the magnetic field, H, through the use of a C-shaped ferromagnetic concentrator. This is useful because for solid blocks of transparent optical material formed from glasses such as SF-6 and SF-15 (manufactured by Schott Glass Technologies, Inc.), the Verdet constant in (mks) units at a wavelength of 850 nanometers is:

(A) for SF-6 glass, V=9.2 radians/(tesla-meter), and (B) for SF-15 glass, V=6.9 radians/(tesla-meter).

The angular amount of rotation, $\theta$, within the solid block optical medium (41) will depend on its specific mechanical design, but can generally be described in functional form as Equation 2, Table 1.

Figure 4B:
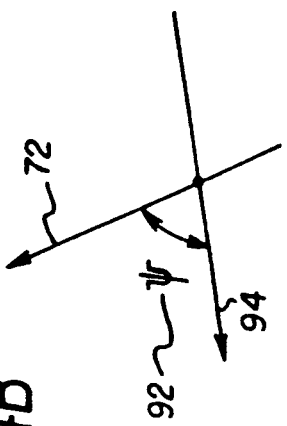
FIGS. 4A, and 4B depict the optical elements of a magnetic concentrator OCT in isolation, and identifies the key optical parameters relevant to the present invention.
Figure 4A:
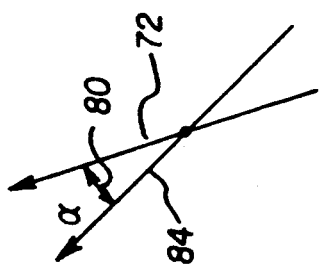
Figure 4:
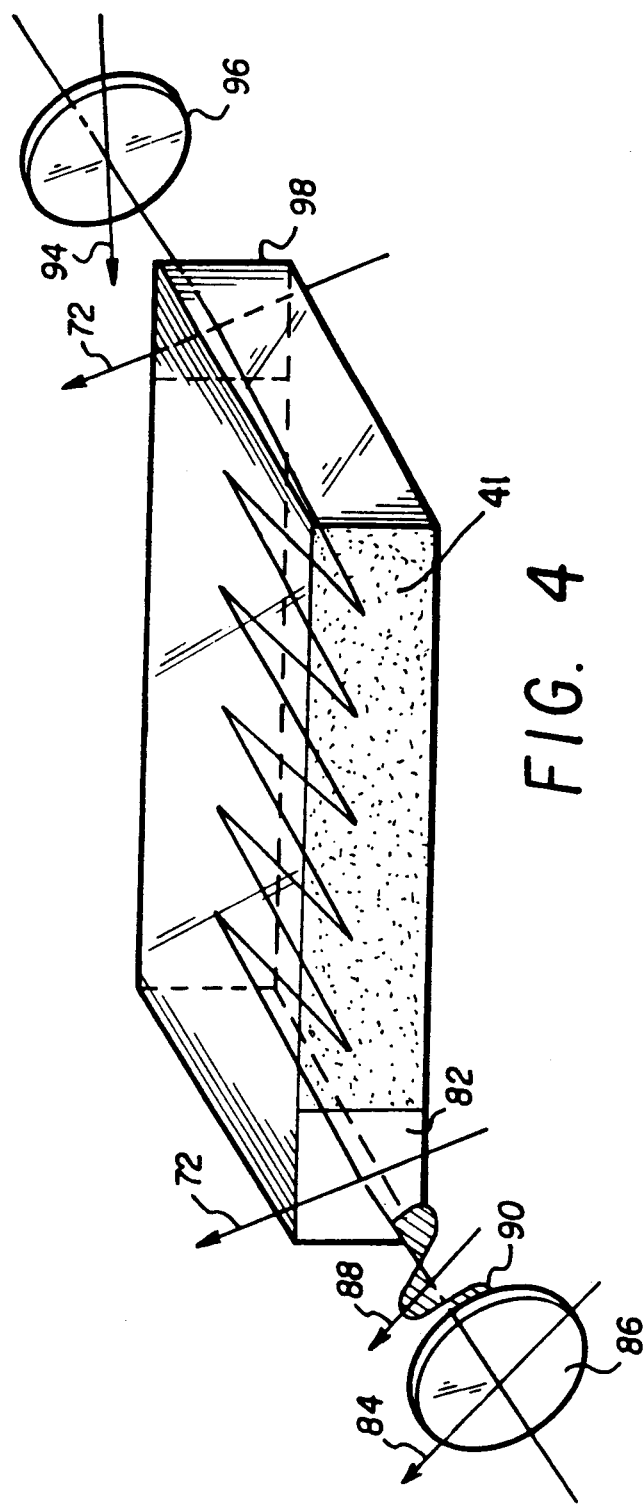

The optical elements of the magnetic concentrator form of OCT are depicted in isolation in FIG. 4 in order to identify the values and parameters used in the inventor's method. Depicted are the polarizer (86), the analyzer (96), with the relationship of the angle $\alpha$ (80) and $\psi$ (92) to the characteristic direction (72) of the optical medium depicted the inserts 4A and 4B respectively. As shown in this Figure the angle, $\alpha$(80) is defined at the entrance face (82) of the previously defined optical material (41). $\alpha$(80) is the angle between the characteristic direction (72) and the orientation of the transmission axis (84) of the polarizer (86) (FIG. 4A). Also shown for clarity is the direction (88) of the linear polarization of the light wave (90) which is, of course, parallel to the transmission axis (84).

Similarly the angle, $\psi$, (92) defines the position of the transmission axis (94) of the analyzer (96) with respect to the characteristic direction (72) at the exit face (98) of the optical medium (41).

The utilization of the inventor's discovery and method of determining certain angles that the polarizer transmission axis makes with respect to a characteristic direction in the optical medium for which the effects of stress birefringence may be discounted however can readily be seen to both simplify the design of the electric current sensor as well as improve the overall accuracy of the apparatus. An apparatus utilizing the inventor's present invention will substantially resemble a present OCT system, but there will no longer be need for splitting the beam and making comparative calculations of the resulting two beams, as taught by Ulmer, page 8, supra or other complex methods of accounting for the effects of stress birefringence.

A single optical signal output is used and this signal output is capable of producing accurate Faraday effect alternating electrical current measurement based exclusively on the difference in the polarization state of the light entering and departing the optical medium. Operation of the Faraday effect electric current sensor will be discussed in terms of a selected characteristic direction.

The basis of the computational scheme is generally discussed below in order to understand the calculations and method to follow. A description of an electromagnetic wave propagating through an optical medium exhibiting both the Faraday effect and stress birefringence has been developed by a number of authors as listed in the references cited. Of particular importance is the analysis presented by the inventor in his 1988 paper Ulmer, page 8, supra which, for the first time, gave explicit formulae showing the behavior of the Faraday effect optical system in terms of the orientation of the polarizer and analyzer with respect to a selected characteristic direction in the birefringent Faraday medium.

Quantities used in the analysis are defined as follows:

F is the Faraday rotation per unit length ($F=\theta/L$), and L is the total path length through the medium.

The symbol $\beta$ is used to designate the linear birefringence per unit length along the path length in the medium.

The quantity $\phi$ is used to designate a combination of Faraday rotation and linear birefringence and is defined at Equation 3, Table 1.

Using the above notation, the relationship between input and output polarization state is as shown in Equation 4, Table 1.

The notations used in Equation 4 are as follows:

E denotes the electric field of the light wave, the subscripts i and o denote input states and output states respectively with respect to the transparent Faraday medium, and the subscripts x and y denote the components of the electric field amplitude E along two orthogonal directions in the system.

A Jones vector representing the light incident on the Faraday medium is given by Equation 5, Table 1.

In the Jones vector $E_p$ is the amplitude of the electric field vector that is incident on the polarizer. Tp is the amplitude transmission coefficient for the electric field in the polarizer parallel to the transmission axis (i.e. $T_p = 1$ if there is no absorption) and $\alpha$ is the angle that the polarizer transmission axis makes with a characteristic direction in the Faraday medium.

The electric field amplitude $E_a$ through an analyzer, with a transmission coefficient $T_a$, whose transmission axis is oriented at an angle $\psi$ from the previously referenced characteristic direction is given by the relation shown in Equation 6, Table 1.

General settings of the polarizer and analyzer are specified by the angles $\alpha$ and $\psi$, respectively. The angles $\alpha$ and $\psi$ are defined in planes orthogonal to the direction of propagation of the light beam.

Combining equations 3, 4, 5 and 6 from Table 1 gives the unique formula which was derived and indicates the behavior of the electric field through the birefringent Faraday medium shown in Equation 7, Table 1.

According to the teachings of the present invention Equation 7, Table 1 is used in the iterative procedure described below to determine what polarizer and analyzer settings produce a signal that is essentially independent of stress birefringence.

Once the electric field quantities are known the optical intensity may be calculated by multiplying through Equation 7, Table 1 by its complex conjugate. For the case where $Tp = Ta = 1$ we have the relationship shown in Equation 8, Table 1.

The more complete calculation repeats Equation 7, Table 1 four times to account for the imperfect polarizer and imperfect analyzer. The imperfection allows a very small amount of light to propagate through orthogonal to the transmission axis. To account for this we sequentially set:

| | | |
|---|---|---|
| (1) Tp = 1 | Ta = 1, | |
| (2) Tp = 1 | Ta = EX, | |
| (3) Tp = EX | Ta = 1, and | |
| (4) Tp = EX | Ta = EX. | |

Where EX is the extinction coefficient of the polarizer and analyzer (which are assumed to be both equal to EX).

All the results of these four electric field calculations are summed before multiplying through by the complex conjugate to obtain the optical intensity.

By repeating this calculation at several points throughout the period of the alternating current waveform the RMS value of the electronic signal produced by the optical signal can be calculated. The output signal can be calculated. The output signal produced by the sensor is denoted by "S" and is defined more precisely hereinbelow. The RMS value of the signal is $S_{RMS}$ because of the disturbing effects of birefringence on this signal, $S(\beta) \neq S(\beta = 0)$. $S(\beta = 0)$ is the output signal at zero birefringence or the "true value" of the Faraday rotation signal. It is convenient to normalize the calculated signal $S_{RMS}(\beta)$ by dividing by $S_{RMS}(\beta = 0)$.

The present invention teaches that one or more predetermined angles exist between the polarizer transmission axis and a characteristic direction in the optical medium such that the birefringence in the optical medium will not significantly distort the final Faraday rotation signal.

Figure 5:
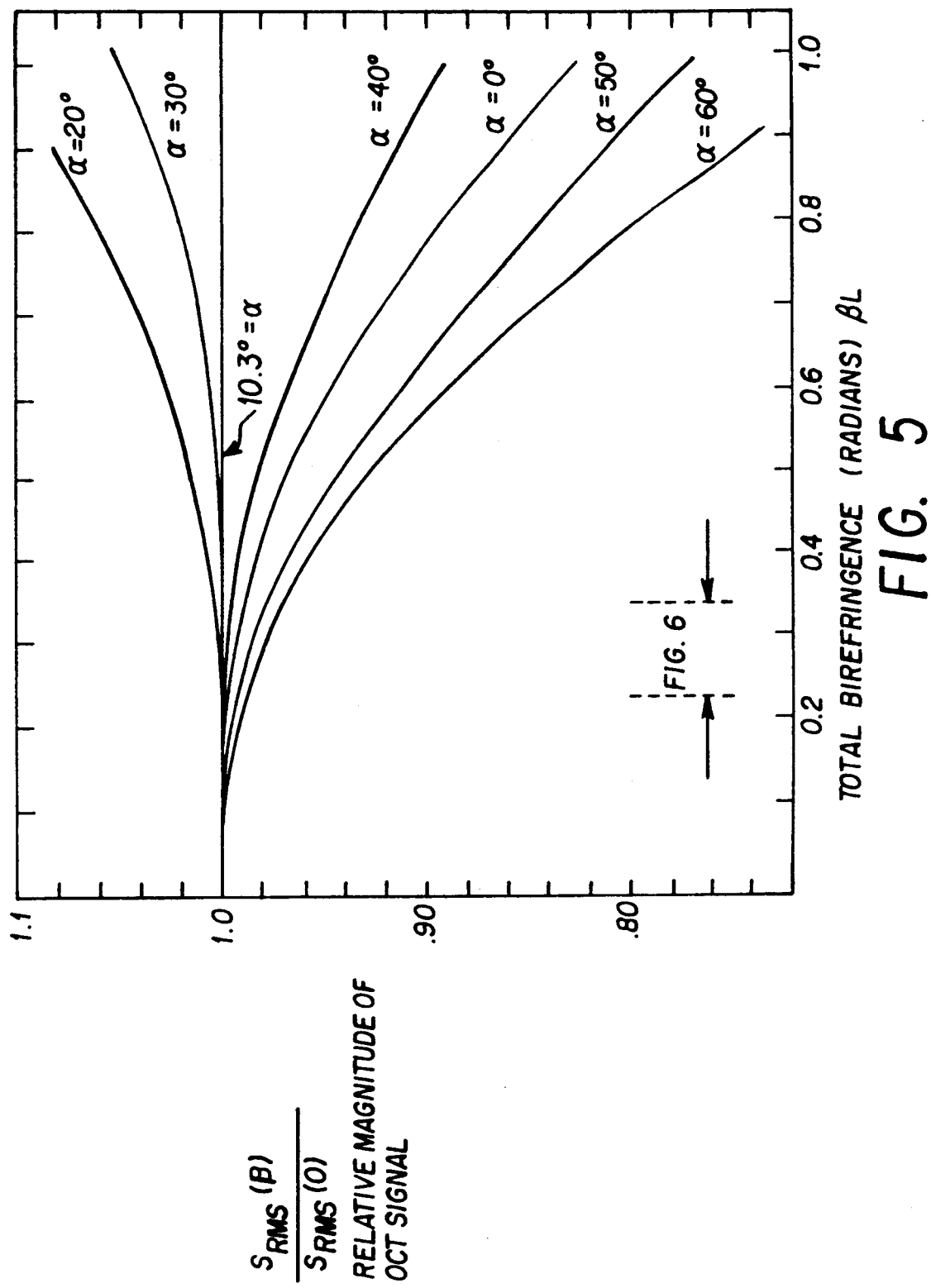
FIGS. 5 and 6 depict a calculated plot of an output signal as a function of birefringence at various angles of polarization of the incoming beam of light with respect to a selected characteristic direction.

To help teach the behavior of these systems and to illustrate the existence of certain special angles $\alpha$, these same equations were used to calculate the signal produced by the electric current sensor with $J = 1000$ amperes in the powerline. FIG. 5 shows how the signal varies as a function of the total birefringence in a piece of SF-6 glass for different angles $\alpha$ that the polarizer transmission axis makes with the characteristic direction. The quantity plotted in FIG. 5 is the value of the output signal $S_{RMS}$ normalized to the value of $S_{RMS}$ at $\beta = 0$.

Figure 6:
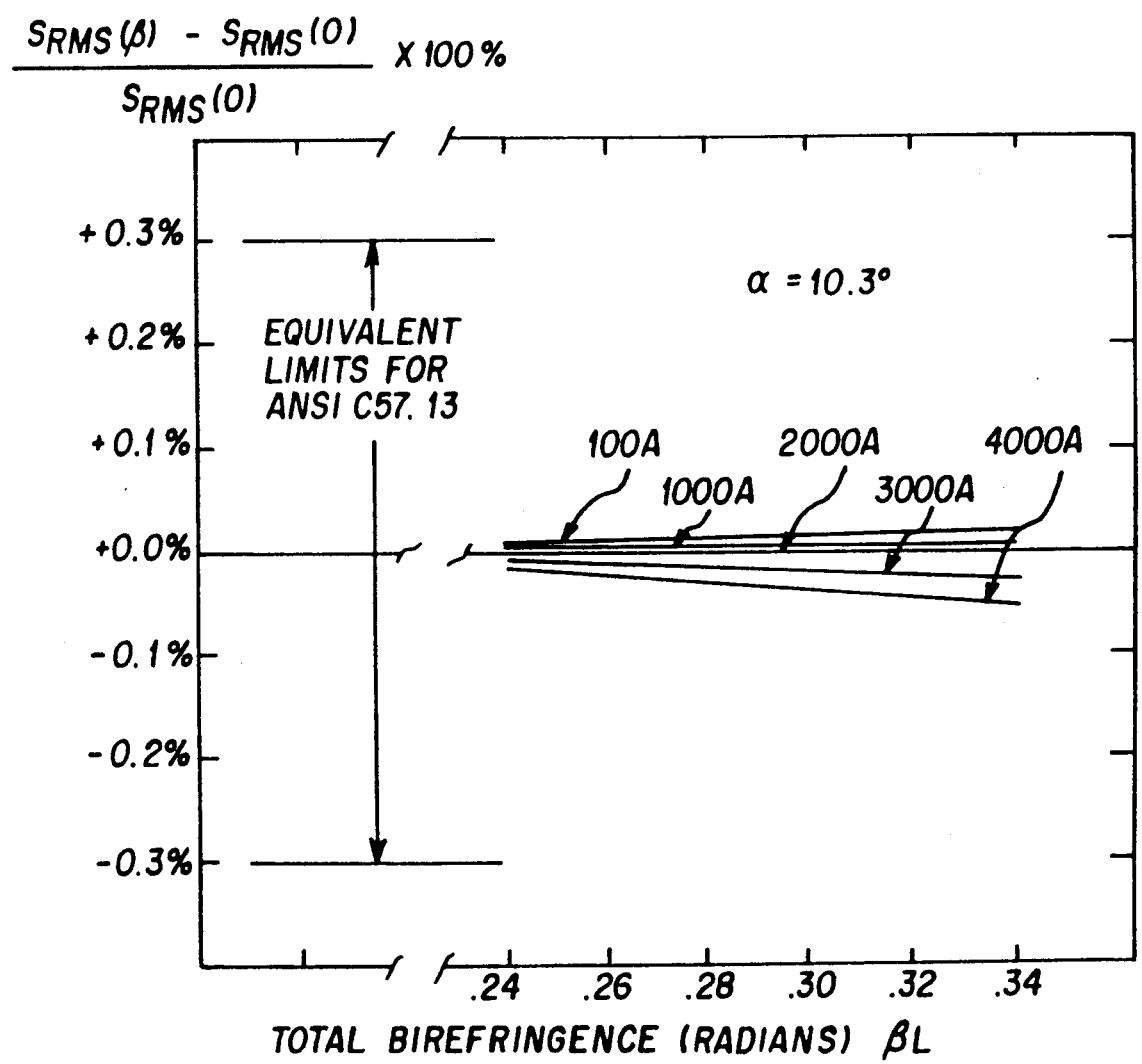

These results show clearly how the signal S can, in the presence of stress birefringence, be distorted from its "true value" at zero birefringence. Whether the signal increases or decreases with birefringence depends on the value selected for the polarizer angle $\alpha$. FIG. 6 is an expanded view of such a plot and shows a $\alpha = 10.3$ degrees the output signal produced is essentially the same for a range of $\beta$ values, as the output signal produced when $\beta = 0$.

In FIG. 6, in the presence of stress birefringence a portion of FIG. 5 is expanded. FIG. 6 shows a plot of the percent deviation of the signal $S(\beta)$ from its value at $S(0)$. As shown in FIG. 6 the signal S has a slight dependence on the value of the electric current. The magnitude of the variation of the signal RMS over a range of values of birefringence $\beta L$ typically found in these sensors (0.24 to 0.34 radians) is well with the accuracy limits imposed on conventional instrument transformers as defined in the standard ANSI C57.13.

METHOD FOR DETERMINING PREFERRED VALUES OF $\alpha$

Now that the mathematical basis has been laid out, the inventor's method is most easily described by making reference to the flow chart of FIG. 7. Herein, the method is described as a series of steps. These steps can be embodied in a computer program to effect this calculation.

In the first step an equation is set up which considers the Faraday effect on light passed through a given optical current detection system as a function of the system geometry, the optical material used, and the range of currents likely to be detected. Birefringence is assumed to be zero.

In the second step, trial values are selected for the magnitude of the angle between the polarizer and analyzer with respect to a characteristic direction of the optical medium. The analyzer angle is typically offset 45 degrees from the polarizer angle.

Referring to the equations in the above mathematical calculation section we see that step 1 is required because Equations 1 and 2 (Table 1) include such paramenters as path length, L, electric current, J, Verdet constant, V, and the permeability, $\beta$, of the optical medium. Step 2 is required because the polarizer angle is the principal parameter being varied during the calculations. In the third step, signal values are thereby calculated for the signal produced by such a system as a result of the Faraday effect produced by the target electric current. Birefringence is still assumed to be held at zero. This series of calculations is outlined in Equations 1,3,4,5,6 and 7, Table 1. Step 3, assuming zero stress birefringence, makes use principally of Equation 7, Table 1. along with the non-zero extinction coefficients for the polarizer and analyzer, as well as the multiplication of the resulting electric field amplitude by its complex conjugate to obtain the optical intensity as described in the above mathematical calculation section.

Steps 4 through 6 concern the calculation of specific polarizer and analyzer angles for which the effects of stress birefringence within the given optical medium may be disregarded. This is done by repeatedly running a variety of trial angles through the system until one or more sets of such trial polarizer and analyzer angles are identified which yield the same signals as those predicted for the system considering zero birefringence.

Step 4 repeats the procedure of step 3 for hypothetical values of stress birefringence, $\beta$, in order to judge whether the signal does or does not change with stress birefringence. In step 5 the designer of the electric current sensor compares the signals from steps 3 and 4 and determines if the deviation between the actual values computed in step 4 with the effects of stress birefringence differ in a significant manner from the signal value of Step 3 at zero birefringence. If required, new values of the trial angles are selected in step 6, and steps 3 through 5 are repeated. Otherwise, the last trial polarizer angle is used to set up the Faraday electric current detection apparatus. Accordingly, it has been shown that polarizer and analyzer angles can be determined and selected to pass a light wave through an optical medium which will produce a signal essentially equal to the signal produced exclusively as a result of Faraday effect rotation.

To briefly summarize this process, first a given Faraday effect current detector is mathematically analyzed assuming zero birefringence. Next, the same system and a trial polarizer angle is mathematically analyzed at various hypothetical values of stress birefringence. When one or more sets of angles are identified for which stress birefringence has no effect, the calculations are complete.

PREFERRED EMBODIMENTS

Figure 8:
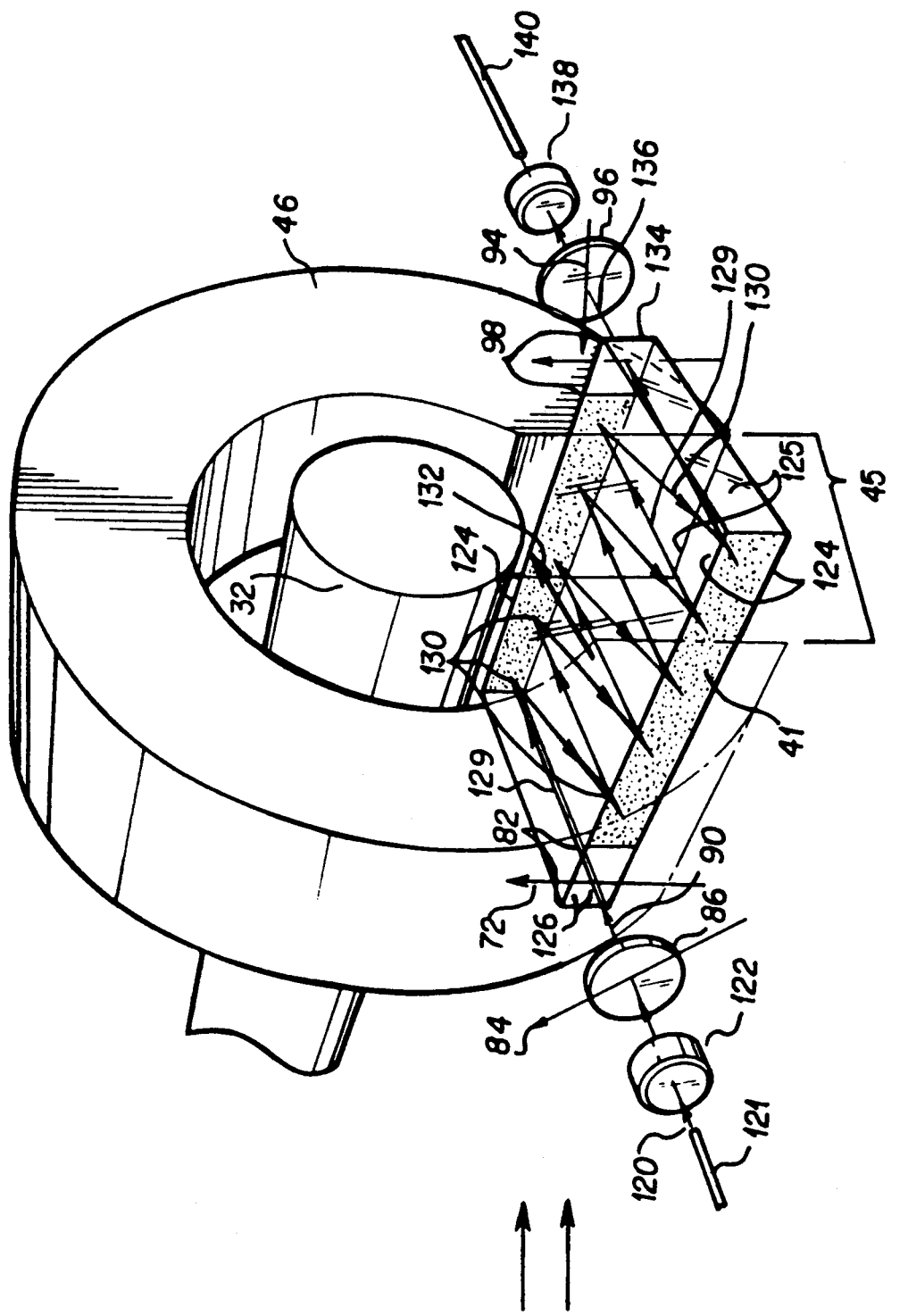
FIG. 8 depicts a full scale magnetic concentrator for of OCT with all elements.

The operation of the preferred embodiment can now be described more fully with reference to an entire magnetic concentrator form of OCT as depicted in FIGS. 4 and 8. A beam of unpolarized light (120) of the proper wavelength from input optical fiber (121) is collimated by lens (122) and converted to linearly polarized light at angle $\alpha$ (80) with respect to the characteristic direction by polarizer (86) producing a linearly polarized light wave (90) which is incident upon input face (82) of the bulk optical medium (41) at point (126). By placing suitable reflective coatings on surfaces (124, 125) of the optical medium (41) the light path (129) is folded into many traverses (130) thereby increasing the optical path length, L.

The optical medium (41) is placed in the gap (45) of concentrator (46) so as to increase the magnetic field strength, H (132), and to substantially align H (132) with the traverses (130) of the light path (129). The light then exits at point (134) on output face (98). The light wave (136) passes through polarization analyzer (96) and is focused with a collimating lens (138) into a light coupling means such as an optical fiber (140).

The particular value for the angle $\alpha$ (80) that the polarizer transmission axis (84) makes with the characteristic direction (72) is determined by the method outlined above.

The operation of the present invention may be enhanced by annealing the optical medium (41). The annealing process serves to reduce the effects of stress birefringence in two ways. First the absolute magnitude of the stress birefringence is reduced because of its increased homogenization after annealing. Second, the characteristic direction (72) associated with stress in the medium (41) can be made to align more closely with the geometric surfaces (124, 125) of the medium (41). In this way temperature changes in the ambient atmosphere (not depicted) surrounding the medium (41) have much less effect on the orientation of these characteristic directions. As a result the calculations and methods described above can more confidently be applied.

In order to properly anneal an optical glass three basic requirements exist. First, the glass must be brought up to a high enough temperature to erase its prior thermal history. Second, the entire glass must achieve the minimum temperature within a narrow range of temperature gradients. Finally, the glass should experience very similar time-temperature gradients throughout the process.

Further information can be found in the article entitled *Fine Annealing of Optical Glass for Low Residual Stress and Refractive Index Homogeneity* by Henry E. Hagy which can be found in Vol 7, page 833, of the May 1988 issue, of "Applied Optics" which is incorporated herein by this reference. Of particular note is the effect of the annealing process on the characteristic direction of the optical medium which can be achieved by controlling the flow of heat out of the optical medium during cooling.

Figure 9:
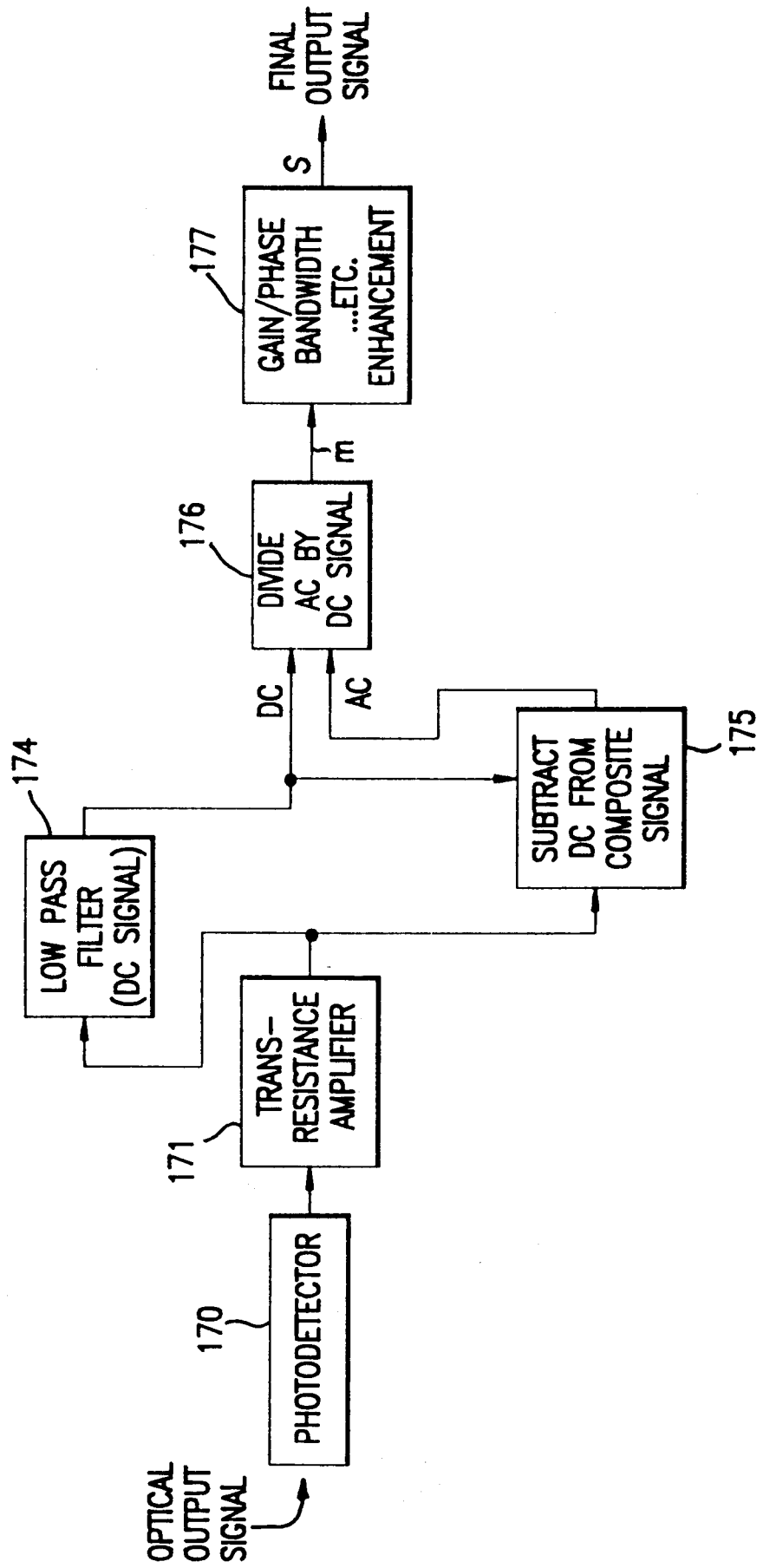
FIG. 9 is a block diagram of the signal processing used with the OCT to detect electric current.

In order to observe the Faraday rotation and provide a measurable output signal which is proportional to the electric current, a system of electronic apparatus is employed. FIG. 9 shows the block diagram of such a system used in conjunction with the optical systems described herein.

A previous method was taught by Ulmer, Hooper, U.S. Pat. No. 4,755,655, July 5, 1988. This method shows that by observing two mutually perpendicular polarization axes, electronic circuitry can be applied whereby the extent of stress birefringence becomes known and can subsequently be suitably eliminated.

The present invention provides a means whereby the effects of stress birefringence in the optical medium are effectively eliminated. Thus, the improved optical system allows for a simplified set of electronic apparatus to be used for Faraday rotation measurements. Whereas the previous method incorporated an electronic system which consists of two optical channels, (Ulmer, Hooper, FIGS. 7, 8, and 16) the present invention allows for the Faraday rotation to be observed with the optical signal from a single photodetector (170).

Through the elimination of the effects of stress birefringence, the optical signal induced by the Faraday rotation can be described by Equation 10, Table 1. In the previous method, the received optical signals on each of the two channels resemble Equation 10, however, additional terms were present which described the nature of the stress birefringence. The elimination of the stress birefringence effects by suitable arrangement of the optical elements, therefore, provides for a simpler optical signal and a more direct means for measuring the electric current.

Equation 10, Table 1 consists of two basic elements: (1) A direct current (DC) term which represents the light intensity which passes through the optical system in the absence of an induced magnetic field which results from an electric in the powerline, and (2) A sine term which contains the angle of rotation $\theta$ due to the Faraday effect.

The alternating electric current varies in time, such as an alternating current (AC) which may vary sinusoidally at some frequency "f", the angle of rotation will also vary in a proportional manner. It therefore becomes possible to distinguish between the DC component of the received light signal and the AC component which contains information relative to the amplitude of an AC electric current. As taught by Ulmer, Hooper, the AC and DC portions of the received optical signal can be separated by means of a low pass filter whereby the cutoff frequency of the filter is sufficiently less than the lowest frequency of desired electric current measurement.

The resultant AC signal is proportional to two independent factors. First, the AC signal amplitude is linearly proportional to the residual light intensity through the optical system. Secondly, the amplitude of the AC signal is proportional to the sine of twice the angle of rotation $\theta$ as indicated in Equation 10 of Table 1. Since, in the measurement process of AC electric current, the Faraday effect provides for an angle of rotation, $\theta$, proportional to electric current, it is possible to eliminate the dependence of the AC signal on residual light intensity by computing the ratio of the AC and DC signals as taught by Ulmer, Hooper.

The resulting quotient of m=AC/DC is therefore proportional to the sine of twice the angle of rotation and provides a measure of the electric current by means of the Faraday effect. That is, the present invention allows for a much simpler application of the method taught by Ulmer, Hooper whereby an output signal m=sin (2$\theta$) is achieved without the need to eliminate the effects of stress birefringence through further electronic signal processing.

Figure 10:
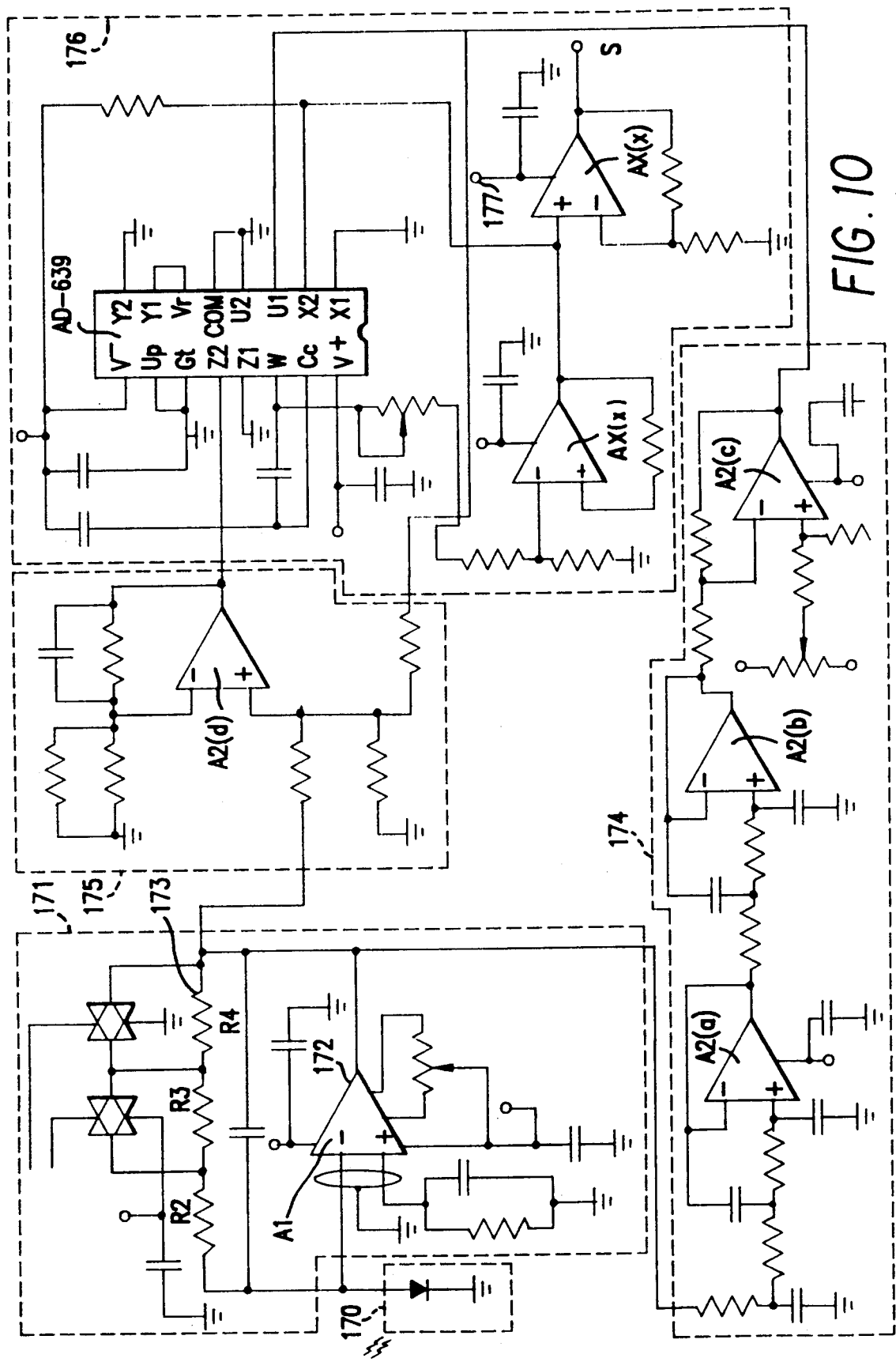
FIG. 10 is a schematic diagram of a circuit designed to measure the alternating electrical current through a conductor by interpreting the output signal from an OCT.

Referring to the schematic in FIG. 10, the present invention allows for the previous method taught by Ulmer, Hooper to be simplified and perform at least the following functions:

(1) A means to detect an optical signal such as that performed by a semiconductor photodiode which results in a diode current proportional to the intensity of incident light (170).

(2) A means (171) to convert said diode current into a proportional voltage signal such as that performed by a transresistance amplifier consisting of at least one operational amplifier (172) and at least one feedback resistor (173).

(3) A means by which the resultant voltage signal, proportional to the incident light, may be separated into its DC and AC constituent parts. Such means may involve:

(a) A low pass filter (174) with an upper cutoff frequency well below that of the lowest frequency of interest in the electric current measurement (174).

(b) A subtraction circuit (175) which subtracts the resultant DC component of the received optical signal from the composite (AC and DC) voltage signal thereby yielding a voltage signal proportional to the AC component of the incident light intensity.

(4) A means by which the ratio of the AC signal to the DC signal is evaluated and thereby yielding the modulation coefficient "m" where m=sin(2$\theta$), and is proportional to the electric current due to the rotated plane of polarization resulting from the Faraday effect. This function may be conveniently performed by an electronic analog multiplier (176).

(5) Additional means may be provided to further enhance the voltage signal "m" which is proportional to the electric current in such a way as to provide a convenient scaling factor through amplification, phase angle correction to compensate for delays throughout the electronic system and additional filtering to tailor the output signal bandwidth over the frequencies of interest (177), and thereby create a final output signal: S.

Table 2 is a plot of actual experimental results of a system described by FIGS. 3A, 4, and 8. The optical medium was SF-6 glass, annealed as described above, with a total path length of 51 cm, placed in a 3″ gap of a ferromagnetic concentrator. The transmission axis of the polarizer was oriented at 10.3 degrees from the characteristic direction. The electric current for this test was 500 amperes. The signal was stable to within ±0.07% over a wide range of temperature. Since temperature differentials within the system, during changes in the ambient temperature, are the primary source of variations in birefringence, this data proves the reliability of the system. Further proof is provided in Table 3 for a system with SF-6 glass at 795 amperes where the polarizer angle, was intentionally set so the signal would be grossly affected by changes in birefringence. Referring again to FIG. 5 it is clear that for angles, $\alpha$, near 60 degrees the output signal experiences its worst possible change with birefringence. For the experimental results of Table 3 $\alpha$ was set to equal 67.5 degrees. As shown in Table 3 a change of temperature of only 15 degrees centigrade produced about a 1% change in the signal. This counter-example proves two things: (1) it helps confirm the overall validity of the calculations as shown in FIG. 5, and (2) it demonstrates convincingly that the angle $\alpha$ that the polarizer makes with the characteristic direction is extremely critical in designing a simplified Faraday effect current sensor.

Summarizing this embodiment with reference once again to FIGS. 3A, 4, 8, and 9, light wave (90) is propagated through the bulk optical medium (41) wherein it experience Faraday rotation and would otherwise, but for the inventor's discovery, be subject to the effects of stress birefringence through the bulk optical medium (41). As a result the effects of stress birefringence can be neglected and high accuracy measurements of electric current can be made using the aforementioned simple electronic detection and signal processing methods.

In a case where the optical path in the transparent medium forms N closed loops around the conductor Ampere's circuital law can be applied to Equation 1, Table 1 to show that, the angular amount of rotation, $\theta$ is given by Equation 9, Table 1, where N is the number of times the optical path encircles the conductor and J is the current in the conductor. FIGS. 3B and 3C are examples of the ring design or loop design of the Faraday effect electric current sensor. For the particular design illustrated in FIG. 3B N=1.

These other embodiments are briefly described. Referring again to the loop of FIG. 3B created with several individual pieces of glass (42), the method described in the present invention may be applied if care is taken to align the selected fast or slow characteristic direction of the individual pieces of glass. In effecting this alignment it is necessary to take into account the 90 degrees rotation in the polarization which occurs at the corner with the two reflectors.

Figure 11:
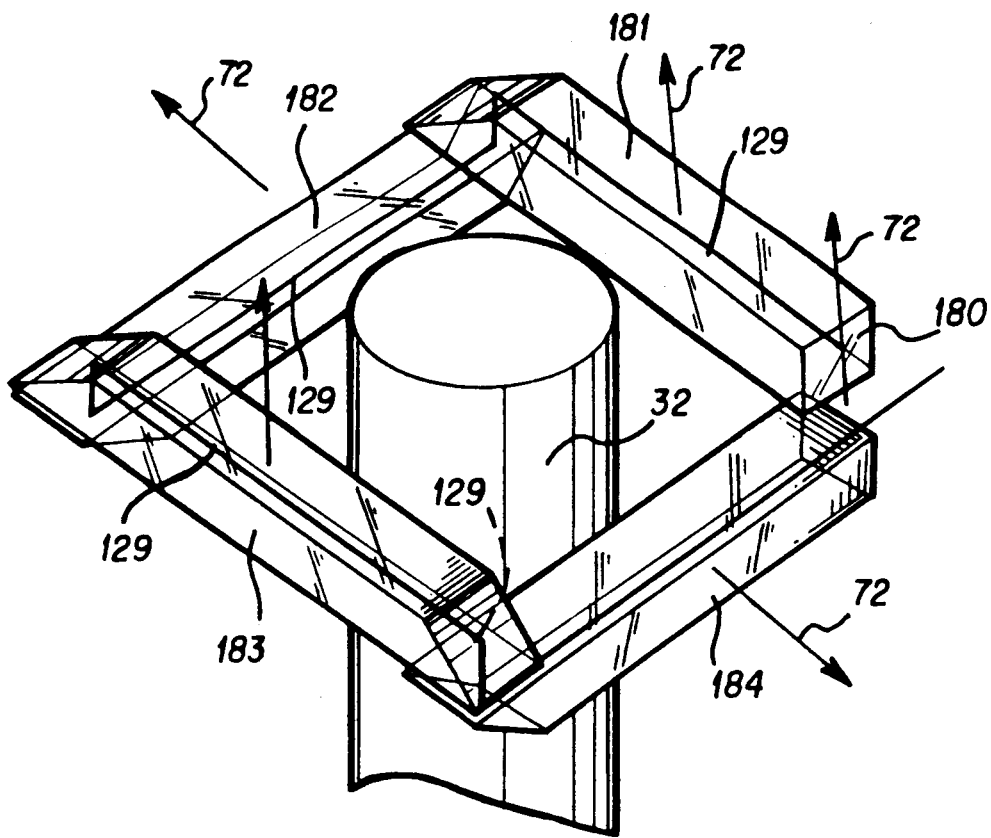
FIG. 11 depicts the optical elements of a corner reflection OCT with attention given to a selected characteristic direction.
Figure 13:
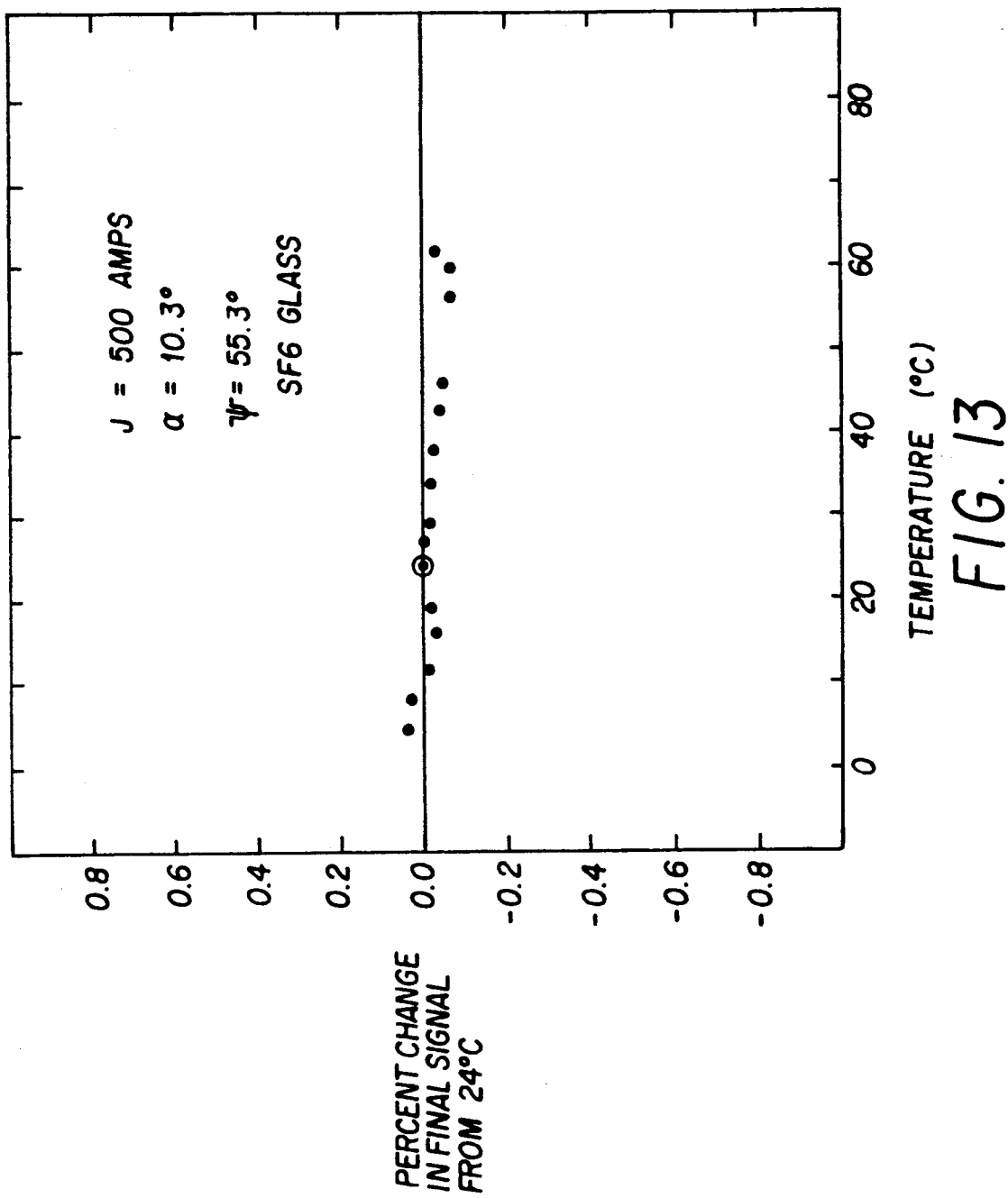
FIG. 13 shows Table 2 which is an experimental plot of the performance of an OCT at a predicted non-birefringent angle.
Figure 14:
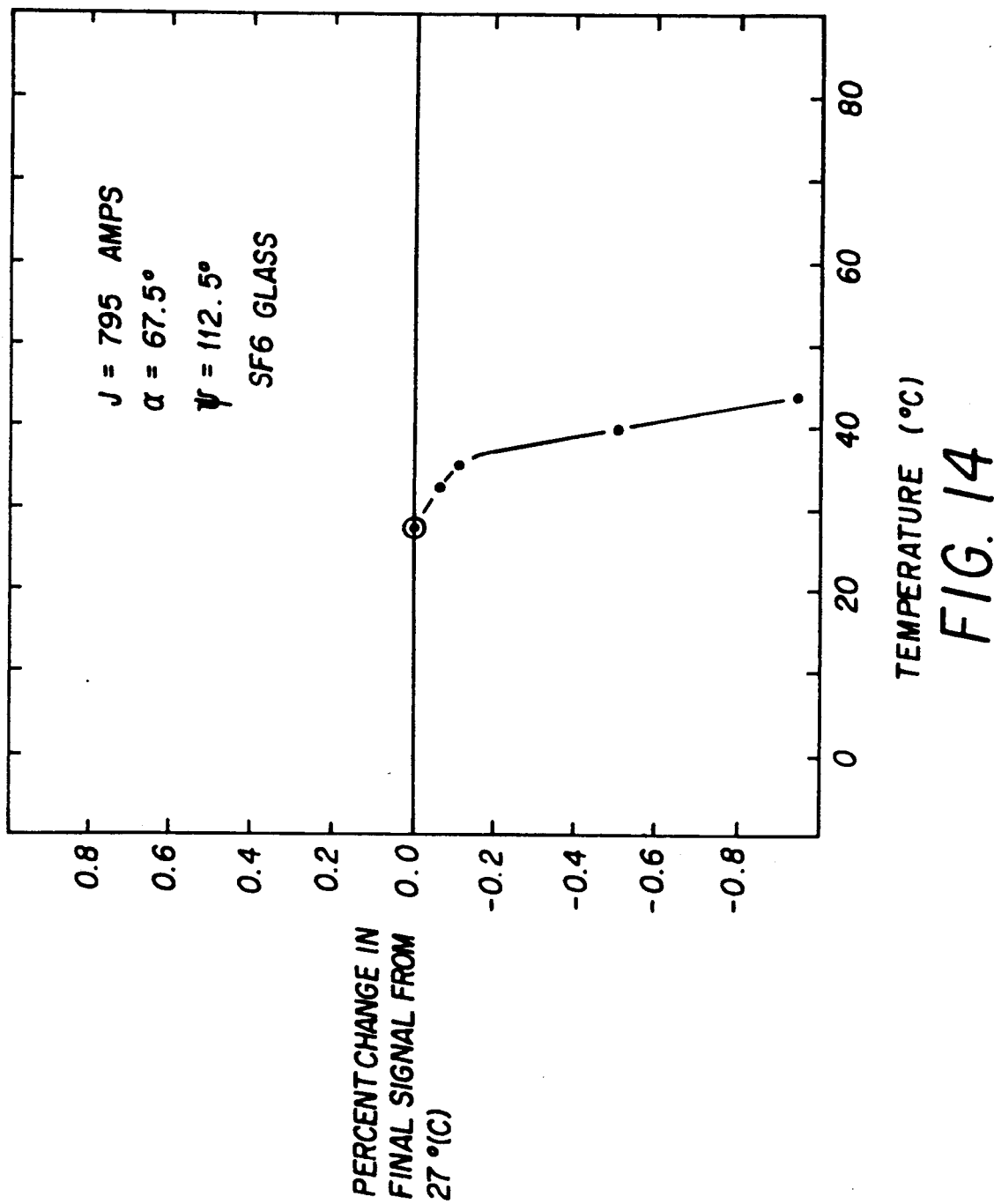
FIG. 14 shows Table 3 which is an experimental plot of the performance of the OCT at an angle predicted to be vulnerable to birefringence.

FIG. 11 shows specifically a loop constructed of several pieces of optical material (181-184). The selected characteristic direction (72) is shown at entrance face (180) of the first of these elements (181). The selected characteristics of the successive elements (182-184) are oriented alternatively parallel, perpendicular, and parallel to the plane formed by the ring. For clarity the selected characteristic direction (72) is indicated as existing throughout each element. Alternating the selected characteristic direction (72) by 90 degrees in combination with the 90 degrees rotation at each corner produces an optical path (129) that appears substantially uniform and continuous. That is, in the quiescent state in the absence of electric current in the powerline a linearly polarized light wave whose plane of polarization at the entrance face (49) is substantially parallel to the selected characteristic direction (72) in first element (181) will remain substantially parallel to the selected characteristic direction (72) as it moves around the ring through the successive elements (182-184).

FIG. 11 is, of course, an isolated view of the optical medium portion of the "ring" style OCT. The optical input and analysis systems, together with the signal processing are exactly as depicted in FIGS. 8, 9, and 10, particularly including the angular relationships between the polarizer, characteristic direction, and analyzer which are the basis of this invention. Sato, et al supra, which is incorporated by this reference, describes in more detail how the optical members may be coupled with reflections and the beam of light is turned 90 degrees at each corner.

In this manner the system obeys the equations and formulae in Table 1 which presume a relatively uniform birefringence, per unit length, $\beta$, throughout the optical material. Since the elongate optical members (141-144) are typically separate pieces of the same bulk optical medium, the annealing process previously described may be used to enhance the operation of a "ring" OCT incorporating this invention.

FIG. 3C illustrates a design which attempts to increase the total path length, L, by increasing the number of loops so that N is greater than 1. FIG. 3C is, of course, an isolated view of the optical media portion of a "loop" style OCT. The optical medium comprises a looped, single mode optical fiber. The characteristic direction (72) of this medium is created by the stress of the looping of the fiber and is radially perpendicular to the flow of current through the fiber.

As with the "ring" OCT (FIG. 11), the optical input and output system, together with the signal processing, may be exactly as in FIGS. 8, 9, and 10, particularly including the angular relationships between the polarizer, characteristic direction, and analyzer which are the basis of this invention. Ulrich, et al, supra, is hereby incorporated by this reference and provides a detailed description as to the means and methods involved in adapting a coiled or looped optical fiber to an OCT apparatus.

For silica (a commonly used material found in the core of optical fibers):

$\mu$ = approximately $\mu$hd o where $\mu$ is permeability of free space; and $\mu$ V = 2.93 × 10$^{-6}$ radians/amp turn at a wavelength of 780 nanometers.

Modification and variation can be made to the disclosed embodiments without departing from the subject and spirit of the invention as defined in the following claims. Such modifications and variations, as included within the scope of these claims, are meant to be considered part of the invention as described.

What is claimed is:

1. A method for minimizing the effect of stress birefringence within the optical apparatus of an optical current transducer providing an optical current signal proportional to a time-varying target current of electricity to be measured, said optical current transducer including at least one optical medium having a Faraday effect, said optical medium receiving a light beam of polarized light and transmitting the received light to produce an optical current signal, comprising the steps of:

geometrically selecting a geometric configuration of said optical medium to be placed within a magnetic field produced by said target current;

orientatedly selecting said optical medium to have an entrance surface, and an exit surface, said optical medium having fast and slow known characteristic directions in which if polarized light is oriented in the absence of a magnetic field the polarized light is transmitted without a change in polarization angle, a known Verdet constant, a known permeability, a known approximate birefringence comprising the difference between a fast index of refraction and a slow index of refractions, each index associated with an associated said characteristic direction and a known path length with respect to said received and transmitted light from said entrance surface to said exit surface from which said optical current signal exits;

mathematically determining the existence and identity of at least one non-birefringent angle of polarization with respect to said characteristic direction of said optical medium at which a polarized beam of light may be received by and transmitted through said optical medium along said path length and produce said optical current signal with a time-varying component, said optical current signal having a current polarization angle proportional to and produced by the target current and proportional to the path, length, the root-mean-square average value of said time-varying component being proportional to the root-mean-square average value of said target current;

aligning said received light with said non-birefringent angle; and measuring said current polarization angle.

2. The method described in claim 1, in which said optical medium is a bulk optical medium and annealed in such a manner as to cause the characteristic directions within said optical medium to substantially line up with the major geometric faces of said optical medium prior to its placement within said magnetic field produced by said target current.

3. The method described in claim 1, in which comprises the additional step of experimentally verifying that said light beam introduced into said optical medium at said non-birefringnet angle may be passed through said optical medium along said path length and produce an optical signal with a time-varying component, the root-mean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said optical medium may be exposed while said target currents are to be detected.

4. The method described in claim 2, which comprises the additional step of experimentally verifying that said light beam introduced into said bulk optical medium at said non-birefringent angle may be passed through said bulk optical medium along said path length and produce an optical signal with a time-varying component, the root-mean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said bulk optical medium may be exposed while said target currents are to be detected.

5. The method described in claim 1, in which the step of mathematically determining said non-birefringent angles further comprises the steps of;
   a. mathematically calculating the Faraday effect rotations on said beam of light passing through said optical medium as a result of several different hypothetical target currents assuming an absence of birefringence at several hypothetical angles between the linear polarization of the said beam of light and the selected characteristic direction of said optical medium;
   b. mathematically calculating the net rotation of a beam of light passing through said optical medium as a result of the Faraday effect rotation caused by said hypothetical target currents together with other hypothetical values of birefringence at said hypothetical angles between the polarity of said beam of light and the characteristic direction of said bulk optical medium;
   c. comparing the mathematical calculations of the rotation due to the Faraday effect alone with the mathematical calculations of the optical signal resulting from the Faraday effect together with stress birefringence; and
   d. repeating steps a.-c. until one or more said angles are found for which said Faraday rotation produces an optical signal with a time-varying component, the root-mean-square average value of said time-varying component being proportional to the root-mean-square average value of said target current.

6. The method described in claim 5, which comprises the additional step of experimentally verifying that said light beam introduced into said bulk optical medium at said non-refringent angle may be passed through said optical medium along said path length and produce an optical signal with a time-varying component, the root-mean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said optical medium may be exposed while said target currents are to be detected.

7. The method described in claim 2, in which the step of mathematically determining said non-birefringent angles further comprises the steps of;
   a. mathematically calculating the Faraday effect rotations (hereinafter Faraday rotations) on said beam of light passing through said bulk optical medium as a result of several different hypothetical target currents assuming an absence of birefringence at several hypothetical angles between the linear polarization of the said beam of light and the selected characteristic direction of said bulk optical medium;
   b. mathematically calculating the net rotation of a beam of light passing through said bulk optical medium as a result of the Faraday effect rotation caused by said hypothetical target currents together with other hypothetical values of birefringence at said hypothetical angles between the polarization of said beam of light and the characteristic direction of said bulk optical medium;
   c. comparing the mathematical calculations of the rotation due to the Faraday effect alone with the mathematical calculations of the optical signal resulting from the Faraday effect together with stress birefringence; and
   d. repeating steps a.-c. until one or more said angles are found for which said Faraday rotation produces an optical signal with a time-varying component, the root-mean-square average value of said time-varying component being proportional to the root-mean-square average value of said target current.

8. The method described in claim 7, which comprises the additional step of experimentally verifying that said light beam introduced into said bulk optical medium at said non-birefringent angle may be passed through said bulk optical medium along said path length and produce an optical signal with a time-varying component, the root-mean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said bulk optical medium may be exposed while said target currents are to be detected.

9. A method for detecting and measuring alternating electric target current passing through a conductor proximate to an optical medium, comprising the steps of:
   geometrically selecting a particular form of an optical medium to be placed within the magnetic field produced by said target current, said optical medium having an entrance surface, an exit surface, said optical medium having a fast and slow known characteristic directions in which if polarized light is oriented in the absence of a magnetic field the polarized light is transmitted without a change in polarization angle, a known permeability, a known Verdet constant, an approximately known birefringence comprising the difference between a fast index of refraction and a slow index of refraction, each index associated with an associated said characteristic direction, and a known path length for a light beam between said entrance surface to said exit surface; p1 mathematically determining the existence and identity of at least one non-birefringent angle of polarization with respect to said characteristic direction of said optical medium at which birefringence is effectively reduced to zero and a polarized light beam may be passed through said optical medium along said path and produce a processed final signal whose value is equivalent to the value of the final signal that would be produced in the absence of stress birefringence in said optical medium;

placing said optical medium within the proximity of the magnetic field produced by said target current;

projecting said polarized light beam through said entrance surface at said non-birefringent angle, along said path, and out of said optical medium at said exit surface, and through a analyzing polarizer to produce a departing beam of light; and measuring the intensity of said departing beam of light and processing said measured intensity to produce a final signal proportional to said target current.

10. The method described in claim 9, in which said optical medium is a bulk optical medium and annealed in such a manner as to cause the characteristic directions within said optical medium to substantially line up with the major geometric faces of said optical medium prior to its placement within said magnetic field produced by said target current.

11. The method described in claim 9, which comprises the additional step of experimentally verifying that said light beam introduced into said optical medium at said non-birefringent angle may be passed through said bulk optical medium along said path length and produce a final signal with a time-varying component, the root-mean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said optical medium may be exposed while said target currents are to be detected.

12. The method described in claim 10, in which comprises the additional step of experimentally verifying that said light beam introduced into said bulk optical medium at said non-birefringent angle may be passed through said bulk optical medium along said path length and produce a final signal with a time-varying component, the root-mean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said bulk optical medium may be exposed while said target currents are to be detected.

13. The method described in claim 9, in which the step of mathematically determining said non-birefringent angles further comprises the steps of;

a. mathematically calculating the Faraday effect rotations on said beam of light passing through said optical medium as a result of several different hypothetical target currents assuming an absence of birefringence at several hypothetical angles between the linear polarization of the said beam of light and said characteristic direction of said optical medium;

b. mathematically calculating the net rotation of a beam of light passing through said optical medium as a result of the Faraday effect rotation caused by said hypothetical target currents together with other hypothetical values of birefringence at said hypothetical angles between the polarization of said beam of light and said characteristic direction of said optical medium;

c. comparing the mathematical calculations of the rotation due to the Faraday effect alone with the mathematical calculations of the optical signal resulting from the Faraday effect together with stress birefringence; and d. repeating steps a.–c. until one or more said angles are found for which said Faraday rotation produces a final signal with a time-varying component, the root-mean-square average value of said time-varying component being proportional to the root-mean-square average value of said target current.

14. The method described in claim 13, in which comprises the additional step of experimentally verifying that said light beam introduced into said optical medium at said non-birefringent angle may be passed through said bulk optical medium along said path length and produce a final signal with a time-varying component, the root-mean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said optical medium may be exposed while said target currents are to be detected.

15. The method described in claim 10, in which the step of mathematically determining said non-birefringent angles further comprises the steps of;

a. mathematically calculating the Faraday effect rotations (hereinafter Faraday rotations) on said beam of light passing through said bulk optical medium as a result of several different hypothetical target currents assuming an absence of birefringence at several hypothetical angles between the linear polarization of the said beam of light and said characteristic direction of said bulk optical medium;

b. mathematically calculating the net rotation of a beam of light passing through said bulk optical medium as a result of the Faraday effect rotation caused by said hypothetical target currents together with other hypothetical values of birefringence at said hypothetical angles between the polarization of said beam of light and said characteristic direction of said bulk optical medium;

c. comparing the mathematical calculations of the rotation due to the Faraday effect alone with the mathematical calculations of the optical signal resulting from the Faraday effect together withstress birefringence; and d. repeating steps a.–c. until one or more said angles are found for which said Faraday rotation produces a final signal with a time-varying component, the root-mean-square average value of said time-varying component being proportional to the root-mean-square average value of said target current.

16. The method described in claim 15, in which comprises the additional step of experimentally verifying that said light beam introduced into said bulk optical medium at said non-birefringent angle may be passed through said bulk optical medium along said path length and produce a final signal with a time-varying component, the rootmean-square average value of said time-varying component being proportional to the root-mean-square average value of said target current within a range of temperatures when subjected to certain selected and fixed target currents, said selected and fixed target currents being selected to test the range of potential target currents to be measured and said range of temperatures selected to test the range of temperatures to which said bulk optical medium may be exposed while said target currents are to be detected.

17. An optical current transducer apparatus for detecting and measuring time-varying electric target current passing through a conductor, the apparatus comprising;

an optical sensor medium in the magnetic field produced by said target current, said optical sensor medium having a specific characteristic direction which in the absence of the magnetic field can receive polarized light oriented with said characteristic direction and transmit the polarized light without changing the polarization angle of the polarized light, and Verdet constant, said optical sensor medium further being adapted with an entrance surface receives a beam of light, a fixed path having a known path length through which said beam of light may travel and an exit surface through which said beam of light may exit said optical medium;

a first linear polarizer which orients a linear polarization of a single beam of light such that said linear polarization is oriented at a non-birefringent angle with respect to said characteristic direction to produce a single non-birefringent light beam received by said entrance surface;

a second polarizer analyzer which is adapted to receive beam of transmitted light upon its departure from said optical sensor medium following receipt of said non-birefringent light beam at said entrance surface and the consequent transmission of light through said optical sensor medium and out of said exit surface and to allow the passage through said analyzer a single analyzer beam, said analyzer beam being only that component of said beam of light which is polarized at a predetermined angle from the angle between said polarizer angle with respect to said characteristic direction, the combination of said non-birefringent angle of said first polarizer and said predetermined angle of said analyzer producing an optical signal of said analyzer beam from said analyzer with a time-varying polarized angular component, the root-mean-square average value of said polarized angular component being proportional to the root-mean-square average value of said target current; and a photoelectric detector which is adapted to receive and measure the intensity of said analyzer beam and produce a corresponding electrical signal.

18. The apparatus described in claim 17, in which said target current is substantially surrounded by a ferromagnetic ring, said ferromagnetic ring adapted to concentrate the magnetic field produced by said target current;

said ferromagnetic ring being further adapted with a ring gap of sufficient volume to permit the insertion of said optical medium which further comprises a bulk optical member and subject said bulk optical member to said concentrated magnetic field, but permit said beam of light to be introduced into said entrance surface at said non-birefringent angle and to depart said bulk optical member through said exit surface and enter said analyzer.

19. The invention described in claim 17, in which said optical medium further comprises three or more separate elongate optical members, said elongate optical members each such optical member adapted with the identical characteristic direction and Verdet constant used to predetermine said non-birefringent angle;

said 3 or more elongate optical members further comprising a first elongate optical member having a first end which is adapted with said entrance surface and another end, a last said optical member having a last end which is adapted with said exit surface and another end, and one or more successive elongate intermediate optical members, each said successive elongate intermediate optical members having two ends;

the said other ends of said first and last elongate optical members and both ends of each said successive intermediate elongate optical members being further adapted with coupling means to optionally couple with said successive intermediate elongate optical members such that each said optical coupling comprises a first reflecting surface and a second reflecting surface, said resulting reflections oriented so as to cause the electric field component of said beam of light to pass from the said other end of said first elongate optical member into each said next successive intermediate elongate optical member and finally the said other end of the said last elongate optical member at an orientation which is perpendicular to its orientation upon each said first reflecting surface;

each said elongate optical member further oriented such that said identical characteristic direction of each said elongate optical member is aligned to be perpendicular with each said coupled elongate optical member, said path length further comprising the length of said first optical member, each said successive intermediate elongate optical member, and said last elongate optical member and further defining an integral number of loops around said target current.

20. The invention described in claim 17, in which said optical medium further comprises a single mode optical fiber, said single mode optical fiber being looped around said target current.

21. The invention described in claim 17, said apparatus further comprising a signal processing means, said signal processing means being adapted to receive said corresponding signal from said photodetector and further comprising;

electronic filtering means for separating the time-varying current and direct current components of said photodetector output signal;

electronic conversion means for converting the time-varying component of said corresponding signal from said photodetector into a final signal with a time-varying component, the root-mean-square average value of said time-varying component being proportional to the root-mean-square average value of said target current.

22. The invention described in claim 18, said apparatus further comprising a signal processing means, said signal processing means being adapted to receive said corresponding signal from said photodetector and further comprising:
electronic filtering means for separating the alternating current and direct current components of said corresponding signal from said photodetector; and
electronic conversion means for converting the time-varying component of said corresponding signal from said photodetector into a final signal with a time-varying component, the root-mean-square average value of said time-varying component being proportional to the root-mean-square average value of said target current.

23. The invention described in claim 19, said apparatus further comprising a signal processing means, said signal processing means being adapted to receive the signal from said photodetector and further comprising;
electronic filtering means for separating the alternating current and direct current components of said photodetector output signal;
electronic conversion means for converting the time-varying component of said corresponding signal from said photodetector into a final signal with a time-varying component, the root-mean-square average value of said time-varying component being proportional to the root-means-square average value of said target current.

24. The invention described in claim 20, said apparatus further comprising a signal processing means, said signal processing means being adapted to receive the signal from said photodetector and further comprising;
electronic filtering means for separating the alternating current and direct current components of said photodetector output signal;
electronic conversion means for converting the time-varying component of said corresponding signal from said photodetector into a final signal with a time-varying component, the root-mean-square average value of said time-varying component being proportional to the root-mean-square average value of said target current.

25. The invention described in claim 18, in which said bulk optical medium is annealed in such a manner as to cause the characteristic directions within said optical medium to substantially line up with the major geometric faces of said optical medium prior to its placement within said magnetic field produced by said target current.

26. The invention described in claim 19, in which each said elongate optical member is annealed in such a manner as to cause the characteristic directions within said optical medium to substantially line up with the major geometric faces of said optical medium prior to its placement within said magnetic field produced by said target current.

27. The invention described in claim 22, in which said bulk optical medium is annealed in such a manner as to cause the characteristic directions within said optical medium to substantially line up with the major geometric faces of said optical medium prior to its placement within said magnetic field by said target current.

28. The invention described in claim 23, in which each said elongate optical member is annealed in such a manner as to cause the characteristic directions within said optical medium to substantially line up with the major geometric faces of said optical medium prior to its placement within said magnetic field produced by said target current.

29. A method for minimizing the effects of stress birefringence and changes in said stress birefringence, such changes in said stress birefringence frequently being produced by changes in ambient temperature, within the optical apparatus of an optical current transducer, thereby making said optical current transducer substantially free of the effects of said ambient temperature, said optical current transducer based on the Faraday rotation effect and useful in measuring a target electric current carried in a target electric conductor comprising the steps of:
selecting a suitable light source such as a light emitting diode emitting a light beam in the near infrared portion of the optical spectrum at a wavelength hereinafter referred to as the operating wavelength;
determining said operating wavelength through the use of such equipment as a monochrometer;
providing a means to drive a substantially constant current through said light source so as to provide a substantially constant output intensity in said light beam;
arranging the principal optical elements of said optical apparatus; said light beam to be transmitted along the main optical axis of said optical apparatus; said principal optical elements being a first polarizer with its first transmission axis and its first polarizer extinction coefficient, Tp, an optical medium described hereinbelow which might consist of one or more physically distinct pieces, and a second polarizer with its second transmission axis and its second polarizer extinction coefficient, said second polarizer being termed an analyzer and said second transmission axis being termed an analyzer transmission axis, and said second polarizer extinction coefficient being termed an analyzer extinction coefficient, Ta; said analyzer transmission axis to be oriented at an analyzer angle of 45 degrees from said first polarizer transmission axis; said analyzer angle to be measured in a plane perpendicular to said main optical axis of said optical apparatus;
arranging said principal optical elements so said light beam propagates first through said first polarizer, then through said optical medium, and finally through said analyzer; said light beam after exiting said analyzer being referred to as the returning light beam; the polarization of said returning light beam no longer being important;
selecting a single optical transmission means among air, vacuum, and optical fibers by which to transmit said light beam from said light source to said first polarizer;
selecting intermediate optical elements such as an achromatic lens, or lenses, as may be necessary to efficiently transmit said optical intensity in said light beam from said light source to said polarizer and hence through the other said principal optical elements; said light beam exiting said polarizer as a plane polarized light beam;
arranging said principal optical elements so as to transmit said light beam through said principal optical elements with a pre-selected efficiency so as to preserve as much of said optical intensity as possible;
selecting a particular material with which to form the optical medium, said particular material being essentially transparent at said operating wavelength and exhibiting a measurable said Faraday rotation effect whereby in the absence of any disturbing effects such as those from said stress birefringence, the plane of said plane polarized light beam is continuously rotated thereby ever increasing the Faraday rotation angle $\phi$ by the action of the component of a magnetic field parallel to said main optical axis of said optical apparatus as said plane polarized light beam propagates along a known path length along said main optical axis of said optical apparatus; said particular material with said measurable Faraday rotation effect having a known magnetic permeability; said particular material with said measurable Faraday rotation effect having a known Verdet constant at said operating wavelength; said Verdet constant being the constant of proportionality between said known path length, said known magnetic field, said known magnetic permeability and said Faraday rotation angle;

adapting or selecting said optical medium to have an entrance surface, an exit surface, and other such reflective surface or surfaces as may be necessary to direct said light beam along a suitable main optical axis of said optical apparatus;

adapting or selecting said optical medium to have two distinct surfaces which are approximately parallel to each other; said two distinct surfaces being defined as a first distinct surface and a second distinct surface; said first distinct surface and said second distinct surface being also parallel to said main optical axis of said optical apparatus;

arranging said particular material by resting said first distinct surface on a first surface of high thermal conductivity material such as aluminum, and bringing said second distinct surface in close proximity to a second surface of high thermal conductivity material such as aluminum which itself is parallel to said first surface of high thermal conductivity material such as aluminum;

annealing said optical medium by raising its temperature as well as the temperature of said first surface of high conductivity material and said second surface of high conductivity material to just above the glass transition temperature of said particular material which was used to form said optical medium, soaking said optical medium for several hours at said temperature just above said glass transition temperature, then slowly cooling said optical medium to approximately 100 degrees centigrade below said glass transition temperature of said particular material which was used to form said optical medium; then rapidly or slowly cooling said optical medium to room temperature and removing said optical medium from the annealing apparatus;

measuring said optical medium using different orientations of said first polarizer transmission axis in the absence of said magnetic field to determine the direction of the two characteristic directions; said two characteristic directions being orthogonal to each other and defined as those directions measured perpendicular to said main optical axis of said optical apparatus, and defined by their action on said plane polarized light beam, or a probe beam of plane polarized light created in a test measurement independent of said optical current transducer, whereby said plane polarized light beam or said probe beam of plane polarized light remains plane polarized as said plane polarized light beam or said probe beam of plane polarized light propagates parallel to either one of said two characteristic directions; said plane polarized light beam or said probe beam of plane polarized light remaining plane polarized because either of said two characteristic directions are characterized by a single albeit different index of refraction; said characterized directions thereby becoming a known first characteristic direction and a known second characteristic direction; a first index of refraction being associated with said first known characteristic direction, and a second index of refraction being associated with said second known characteristic direction;

measuring the difference between said first index of refraction being associated with said first known characteristic direction and said second index of refraction being associated with said second known characteristic direction; such measurement done at said operating wavelength using for example such equipment as a Soliel-Babinet compensator; said difference arising as it does from small mechanical stresses in said particular material being defined as the stress birefringence; said stress birefringence being largely determined by the thermal history of said particular material is defined as residual stress birefringence; said annealing of said optical medium producing said first characteristic direction perpendicular to both said first distinct surface of said optical medium, and to said second distinct surface of said optical medium, and said second characteristic direction parallel to both said first distinct surface of said optical medium, and to said second distinct surface of said optical medium; and as a result said stress birefringence now being a known residual stress birefringence; said characteristic directions thereby remaining relatively fixed as said ambient temperature changes produce small mechanical stresses parallel to said first and second distinct surfaces;

positioning said optical medium in known proximity to said target electric conductor; said target electric current creating said magnetic field; said geometry of said known proximity permitting apriori approximate knowledge of said magnetic field along said main optical axis of said apparatus to be expected from said target current;

selecting a suitable light detector such as a silicon photodiode and sensitive to said returning light beam at said operating wavelength;

connecting said light detector to electronic signal processing means;

selecting an optical transmission means such as air, vacuum, and/or optical fibers by which to transmit said returning light beam from said analyzer to said light detector;

calculating the Faraday rotation per unit length as the total said Faraday rotation angle produced by the action of said magnetic field along all of said optical path length within said optical medium, divided by said optical path length;

calculating the birefringence per unit length as the total said known residual stress birefringence produced by said optical medium along all of said optical path length within said optical medium, divided by said optical path length;

calculating a parameter phi as twice the sum of the square of said Faraday rotation angle per unit length and the square of half said birefringence per unit length;

defining an angle alpha that said first transmission axis of said first polarizer makes with either said first known characteristic direction or said second known characteristic direction, the particular characteristic direction chosen to be known as the selected characteristic direction, and letting the angle psi define said analyzer angle and be therefore equal to said angle alpha plus 45 degrees;

arranging said optical medium so said main optical axis of said optical apparatus forms one or more integral loops around said target electric conductor and therefore said target electric current passes through the plane formed by said optical medium;

calculating said expected root mean square, rms, response from said optical current transducer by using well known formulae describing said Faraday rotation effect and said stress birefringence when they co-exist in the same said optical medium; said expected response to be calculated using said known magnetic permeability, said known path length, said angle alpha, said angle psi, said parameter phi, said first polarizer extinction coefficient, said analyzer extinction coefficient, said known Faraday rotation per unit length, said known residual stress birefringence per unit length, said known magnetic field;

repeating said calculation of said expected rms response from said optical current transducer, and varying during these repetitions of said calculations said angle alpha associated with the first polarizer, with the intention of defining a specific angle alpha such that said expected rms response in the presence of stress birefringence does not differ significantly from the ideal response when said known residual birefringence is set equal to zero as would be the case in an ideal birefringence-free optical medium; said repetitions defining a non-birefringent angle alpha at which to set said first polarizer with respect to said selected characteristic direction;

repeating said calculations of said expected response for different hypothetical target electric currents to be sure that said non-birefringent angle alpha calculated at one hypothetical target electric current does not differ significantly from said non-birefringent angle alpha calculated at another hypothetical target electric current; these second sets of calculations producing a final non-birefringent angle at which said expected response does not differ significantly from said ideal response as either said hypothetical target current or said stress birefringence is varied;

adjusting the actual position of the actual said first transmission axis of the actual said first polarizer to said final non-birefringent angle;

creating an output signal from said signal processing means substantially proportional to and substantially in phase with said target electric current, said output signal being thereby essentially free from said changes in ambient temperature.

* * * * *